United States Patent [19]

Sakai

[11] Patent Number: 5,596,586
[45] Date of Patent: Jan. 21, 1997

[54] FAILURE SIMULATION METHOD

[75] Inventor: Hiroaki Sakai, Hyogo, Japan

[73] Assignee: Mitsubishi Denki Kabushiki Kaisha, Tokyo, Japan

[21] Appl. No.: 448,663

[22] Filed: May 24, 1995

[30] Foreign Application Priority Data

Jul. 14, 1994 [JP] Japan ................................. 6-162204

[51] Int. Cl.$^6$ ........................................... G06F 11/00
[52] U.S. Cl. ........................ 371/25.1; 364/578; 371/26
[58] Field of Search ........................ 371/25.1, 26, 67.1, 371/3; 395/183.08, 183.09; 364/550, 578, 551.01, 552

[56] References Cited

U.S. PATENT DOCUMENTS 4,773,028  9/1988  Tallman ................................. 371/25.1
5,189,365  2/1993  Ikeda et al. ........................ 395/183.09

FOREIGN PATENT DOCUMENTS 63-24173  6/1988  Japan.
63-75576  9/1988  Japan.

Primary Examiner—Robert W. Beausoliel, Jr.
Assistant Examiner—Trinh L. Tu
Attorney, Agent, or Firm—Leydig, Voit & Mayer

[57] ABSTRACT

Specific values $X_1$ to $X_n$ are set to signal lines both in a normal circuit having no failure and in a failure circuit having an assumed failure (in the step S11). Applying a test vector F to the circuits, a simulation of signal propagation is performed (in the step S14). Since the specific values or the inverted specific values instead of undefined values propagate on the signal lines, with respect to more types of failures than ever, it becomes possible to determine the capability of the test vector for detecting different kinds of failure.

11 Claims, 27 Drawing Sheets

# FAILURE SIMULATION METHOD

BACKGROUND OF THE INVENTION

1. Field of the Invention

The present invention relates in general to a failure simulation method, and more particularly to a technique for determining whether the test vector is capable of detecting an assumed failure in an integrated circuit.

2. Description of the Background Art

FIGS. 24 to 26 are circuit diagrams illustrating a failure simulation method in the background art. FIGS. 24 to 26 show the same circuit which comprises an OR gate 5 having input ends 5a and 5b connected to signal lines 1 and 4, respectively, and an output end connected to a signal line 3, and a flip flop 7 having an input end D connected to the signal line 3 and an inverted output end QC connected to signal lines 4 and 6 in common and a clock end CLK connected to a signal line 2 through which a clock signal is applied. The circuit processes a signal inputted from the signal line 1 and outputs the processed signal to the signal line 6.

The failure simulation method in the background art will be described taking a case of detecting a failure of the signal line 1 stacked at 1.

At first, the first value of the test vector, "1", is applied to the signal line 1 as shown in FIG. 24. No matter whether the signal line 1 experiences a failure of being stacked at 1 (SA1) or not, the value "1" is applied to the input end 5a of the OR gate 5. Accordingly, the OR gate 5 outputs "1", to the signal line 3, regardless of the logical value on the signal line 4. Then, the value "1" is applied to the input end D of the flip flop 7.

When an activated clock signal (hereinafter, referred to as "P") propagates on the signal line 2, the inverted output end QC outputs the value "0" to propagate on the signal lines 4 and 6. Although the value "0" on the signal line 4 is applied to the input end 5b of the OR gate 5, the OR gate 5 outputs the value "1" and therefore the signal line 3 still propagates the value "1".

Next, the second value of the test vector, "0", is applied to the signal line 1. If the signal line 1 is in a normal condition, the OR gate 5 receives the value "0" from the signal line 4 and then outputs the same value "0" to the signal line 3, as shown in FIG. 25. When "P" is on the signal line 2, the inverted output end QC of the flip flop 7 outputs the value "1" to the signal line 6.

Thus, if the circuit has no failure, the sequence of applications of the first test vector value "1", "P", the second test vector value "0", and again "P" results in the sequence of propagations of "0", "1" on the signal line 6.

On the other hand, if the signal line 1 experiences the failure of SA1, as shown in FIG. 26, the input end 5a of the OR gate 5 receives the value "1" even when the second value of the test vector "0" is applied to the signal line 1. Accordingly, the value "1" propagates on the signal line 3. When "P" is on the signal line 2, the inverted output end QC outputs the value "0".

Thus, if the circuit has such a failure that the signal line 1 is stacked at 1, the sequence of applications of the first test vector value "1", "P", the second test vector value "0", and again "P" results in the sequence of propagations of "0", "0" on the signal line 6.

In other words, the sequence of applications of the test vector values "1", "0" with timing of the propagation of "P" on the signal line 2 and the check of the sequence of output values on the signal line 6 can detect whether the signal line 1 experiences the failure of SA1. The sequence of output values "0", "1" indicates that the circuit is in a normal condition and "0", "0" indicates that the circuit has the failure of the signal line 1 stacked at 1.

Therefore, it is possible to judge that the test vector "1", "0" applied to the signal line 1 is capable of detecting the failure of the signal line 1 stacked at 1 in the circuit shown in FIGS. 24 to 26.

However, the failure simulation system in the background art is not capable of detecting a failure of the signal line 1 stacked at 0 (SA0). FIG. 27 shows the same circuit as FIG. 26 with the signal line 1 stacked at 0.

In this case, no matter whether the test vector value applied to the signal line 1 is "1" or "0", the input end 5a of the OR gate 5 receives the value "0". Then, the value applied to the input end 5b of the OR gate 5 propagates on the signal line 3. The value outputted from the inverted output end QC of the flip flop 7 is undefined, and so is the value on the signal line 4. The simulation proceeds with an undefined value "X" propagating on the signal line 4. The undefined value "X" also propagates on the signal line 3, and therefore the value on the signal line 4 after the propagation of "P" on the signal line 2 is still undefined. In other words, the value on the signal line 4 remains "X" (undefined) all the way of the simulation.

In detecting the failure of the signal line 1 stacked at 1, it is possible to generate the test vector which is capable of detecting the failure since the value from the inverted output end QC of the flip flop 7 is reset to the value "0". On the other hand, in detecting the failure of the signal line 1 stacked at 0, the values on the signal lines 3 and 4 are not defined since the value from the inverted output end QC of the flip flop 7 can not be reset, whatever is applied to the signal line 1 or however often "P" is given to the signal line 2.

In other words, there is a problem that it is extremely difficult to determine the capability of any test vector for detecting the failure of the signal line 1 stacked at 0 in the circuit of FIGS. 24 to 27.

SUMMARY OF THE INVENTION

The present invention is directed to a failure simulation method for determining whether at least one test vector is capable of detecting at least one type of failure occurring in a circuit to be tested including a plurality of signal lines and at least one logical element. In the failure simulation method, the test vector provides at least one of the signal lines with a logical value "1" or "0". According to the first aspect of the present invention, the failure simulation method comprises steps of: (a) preparing a failure circuit which corresponds to the circuit to be tested with the failure; (b) setting at least one specific value uniquely to the at least one signal line in the failure circuit; (c) applying the test vector to a normal circuit which is the circuit to be tested with no failure and to the failure circuit; (d) propagating the logical value on the signal lines both in the normal circuit and in the failure circuit; (e) obtaining a normal result which propagates on a specific one of the signal lines in the normal circuit and a failure result which propagates on the specific one of the signal lines in the failure circuit; and (f) comparing the normal result with the failure result to determine whether the test vector is capable of detecting the failure. The specific value generally represents either the logical value "1" or "0".

In the failure simulation method in accordance with the first aspect of the present invention, the specific values each of which generally represents either of the logical value "1" or "0", without defining which, are set to the signal lines. On the signal line, the specific value or the inverted specific value propagates instead of the undefined value.

Thus, it becomes possible to determine the capability of the test vector even for detecting such a failure as the background art can not cope with, thereby ensuring a failure simulation with more accuracy.

Particularly, according to the first aspect of the present invention, since the normal result and the failure result both necessarily have any of the following: logically defined value, specific value or inverted specific value: judgment as to agreement or disagreement between the normal result and the failure result can be made for more types of failures than ever before. Therefore, it becomes possible to determine the capabilities of the test vectors for detecting the failures not only in the case the background art failure simulation method has coped with but also in the case the background art has not coped with.

According to the second aspect of the present invention, the at least one type of failure includes a plurality of types of failures, and the method further comprises, prior to the step (a), a step of: (x) classifying the plurality of types of failures into a first group and a second group depending on the necessity of setting the specific values. The first group includes the failures which need setting of the specific values and the second group includes those which do not need such setting. The step (b) is performed only for the failures included in the first group, and the steps (a) to (f) are performed with respect to each of the failures.

In the failure simulation method in accordance with the second aspect of the present invention, the specific values are set only when the failure needs the setting to be detected.

Therefore, a failure simulation method with more simplicity is ensured to achieve the same effect as in the failure simulation method in accordance with the first aspect.

According to the third aspect of the present invention, the step (x) comprises steps of (x-1) propagating a logical value in the failure circuit; (x-2) specifying at least one of the logical elements from which the logical value can not further propagate as a forefront signal input element; (x-3) propagating a failure propagation flag from the forefront signal input element; and (x-4) judging whether a possibility of resetting a propagation loop of the failure propagation flag if the failure propagation flag propagates in a loop exists, to classify the failures into the first group and the second group depending on the judging. The first group includes the failures when the possibility of resetting does not exist, and the second group includes the failures when the possibility of resetting exists.

In the failure simulation method in accordance with the third aspect of the present invention, when the failure propagation flag propagates in a loop, judgment as to whether the failure needs the setting of the specific values to be detected is made depending on whether the possibility of resetting the propagation loop exists.

Since the propagation loop represents a propagation extent of the undefined value, it is judged that there is a test vector to reset the undefined value when there is a possibility of resetting the propagation loop. Accordingly, it is not necessary to set the specific values in the case of being possible to reset the loop, thereby achieving the same effect as in the failure simulation method in accordance with the second aspect.

According to the fourth aspect of the present invention, the failure simulation method further comprises, prior to the step (a) and after the step (x), a step of: (y) detecting at least one of the signal lines which needs setting of the specific values. In the step (b), the specific values are set to only the at least one signal line detected in the step (y). The steps (a) to (f) are performed with respect to each of the plurality of types of failures.

In the failure simulation method in accordance with the fourth aspect of the present invention, the specific values are set only to the signal lines which need the setting of the specific values to detect the failure.

Therefore, a failure simulation method with more simplicity is ensured to achieve the same effect as in the failure simulation method in accordance with the first aspect.

According to the fifth aspect of the present invention, the step (y) has steps of (y-1) performing a backward tracing from a loop causing element along propagation of the failure propagation flag to detect at least one of the logical elements which is disposed in the propagation loop and determines its output with timing of activation of a clock signal; and (y-2) detecting at least one of the signal lines connected to an output end of the logical element detected in the step (y-1) as a signal line which needs setting of the specific value, wherein the loop causing element is at least one of the at least one forefront signal input element causing the loop.

In the failure simulation method in accordance with the fifth aspect of the present invention, the specific values are set only to the signal lines connected to the output ends of the elements which determine their outputs depending on the propagation of the clock signal. Furthermore, since it is not necessary to set the specific values to the signal lines which have no possibility of propagating the undefined values, the specific values need to be set only to the signal lines connected to the output ends of the elements which determine their outputs depending on the propagation of the clock signal and which are located in the propagation loop of the failure propagation flag where no possibility of resetting exists.

Thus, detection of the signal lines connected to the output ends of the elements which output logical values depending on the propagation of the clock signal to the propagation loop representing the propagation extent of the undefined values is made, and then the specific values are set only to the detected signal lines, thereby achieving the same effect as in the failure simulation method in accordance with the fourth aspect.

According to the sixth aspect of the present invention, the at least one test vector includes a first test vector to an n-th test vector (n 2), and the step (b) has steps of (b-1) setting the specific values to all of the signal lines in the failure circuit; (b-2) providing the first test vector both in the normal circuit and in the failure circuit; (b-3) propagating the first test vector in the normal circuit; (b-4) propagating the first test vector and the specific values in the failure circuit; (b-5) storing at least one of the signal lines which propagates either the specific value or an inverted specific value in the step (b-4); (b-6) obtaining the normal result and the failure result through the steps (b-3) and (b-4); (b-7) comparing the normal result with the failure result obtained in the step (b-6) and thereby judging whether the first test vector is capable of detecting the failure; and (b-8) setting the specific values only to the signal lines stored in the step (b-6). The steps (c) to (f) are performed with respect to each of a second test vector to the n-th test vector.

In the failure simulation method in accordance with the sixth aspect of the present invention, the specific values are set to all of the signal lines in the simulation using the first test vector to judge the capability thereof for detection of a failure. From the result of the simulation, it is judged that it is not necessary to set the specific values to the signal lines which propagate the values other than the specific value or the inverted specific value.

Thus, it is not necessary to set the specific values to the signal lines which propagate the values other than the specific value or the inverted specific value since the signal lines are provided with the logical values in the simulation. Therefore, the tests using the second and further test vectors are performed more simply to achieve the same effect as in the failure simulation method in accordance with the first aspect.

An object of the present invention is to provide a failure simulation method by which determination can be made as to the capability of a test vector for detecting more types of failures.

In other words, an object of the present invention is to improve the capability of a generated test vector for detecting a failure. Another object is to increase productivity of test vectors for detecting a failure.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
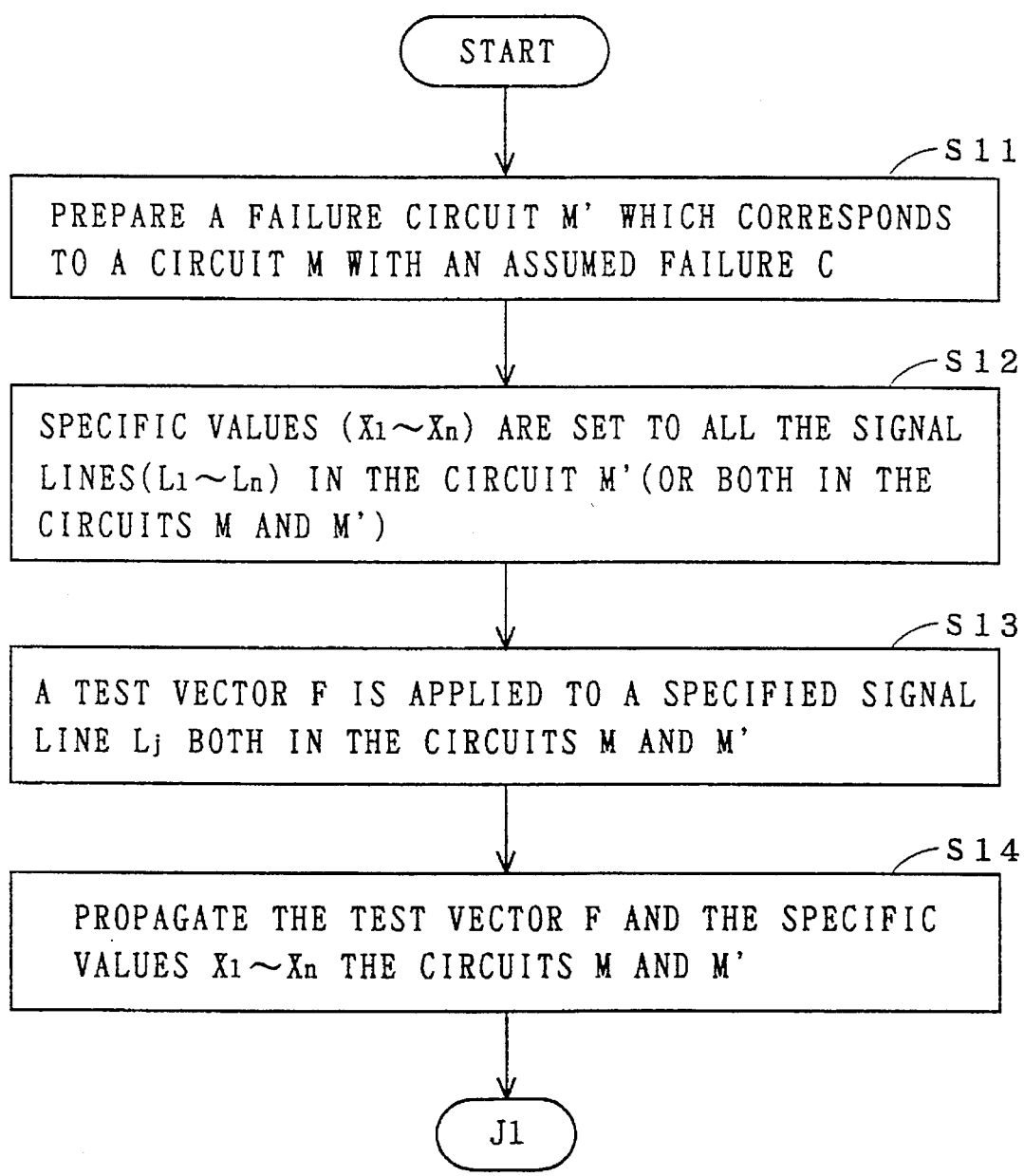
FIGS. 1 and 2 are flow charts cooperatively showing a first preferred embodiment of the present invention.
Figure 2:
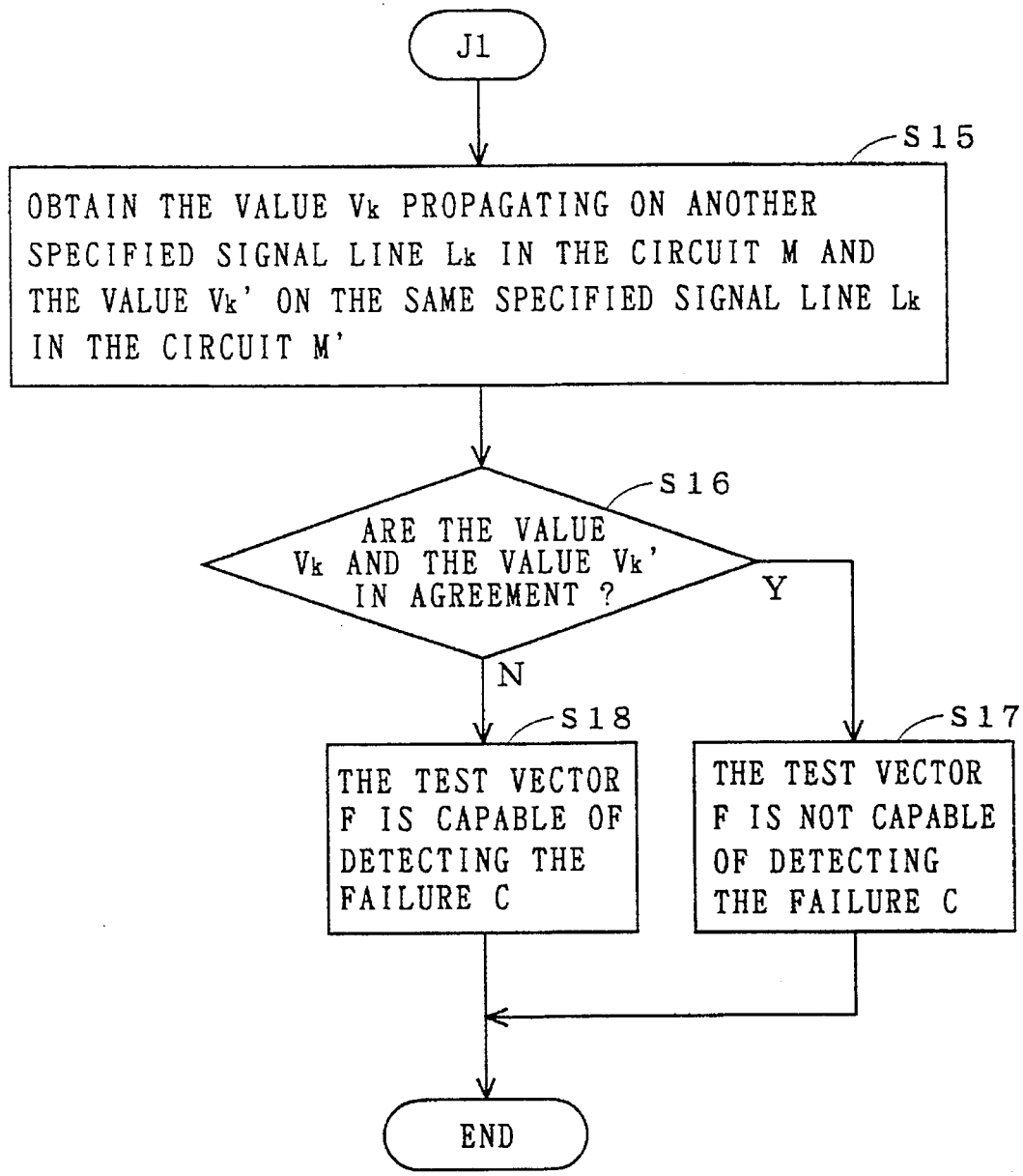
Figure 3:
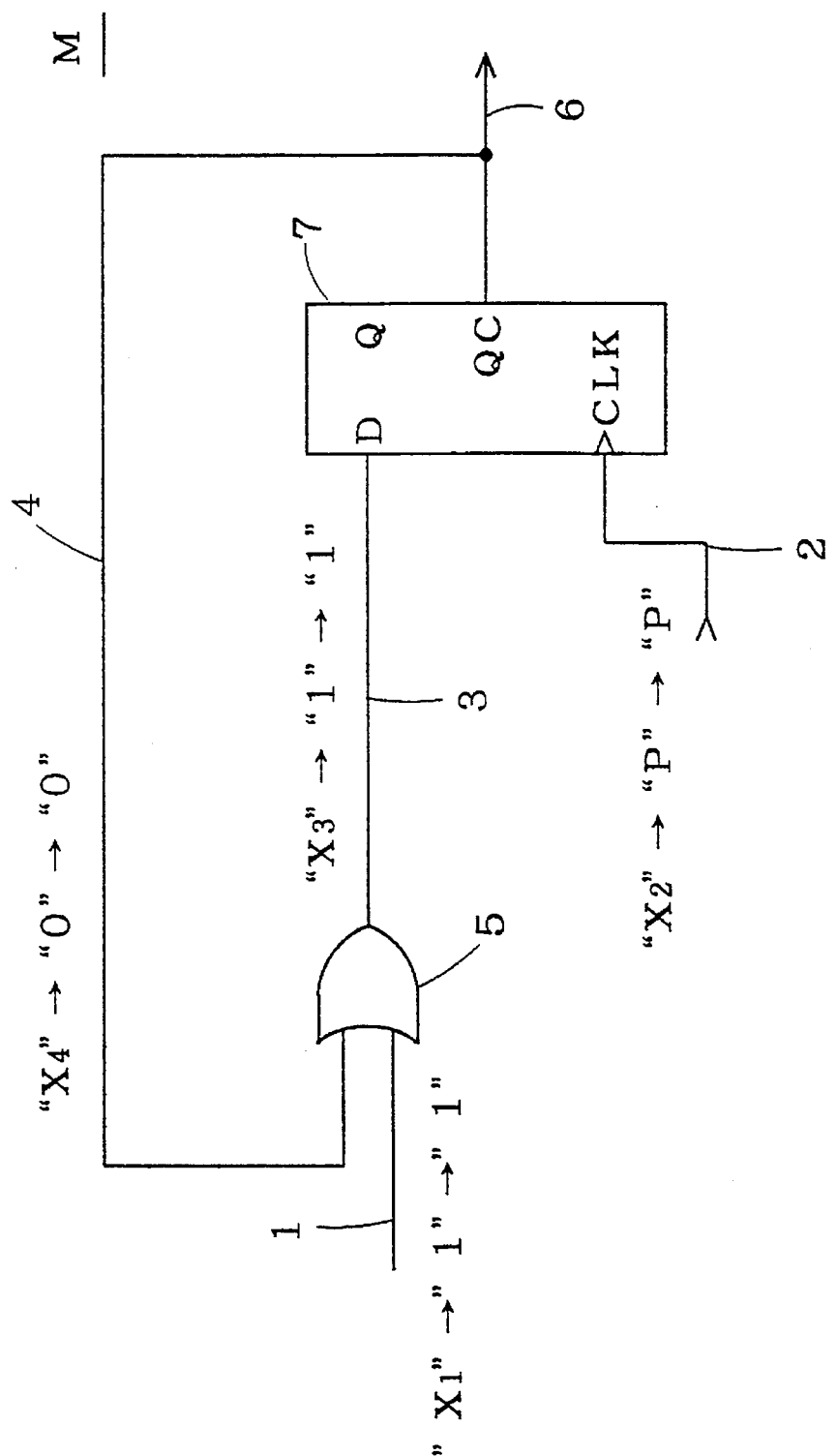
FIGS. 3 to 6 are circuit diagrams illustrating the first preferred embodiment of the present invention.
Figure 4:
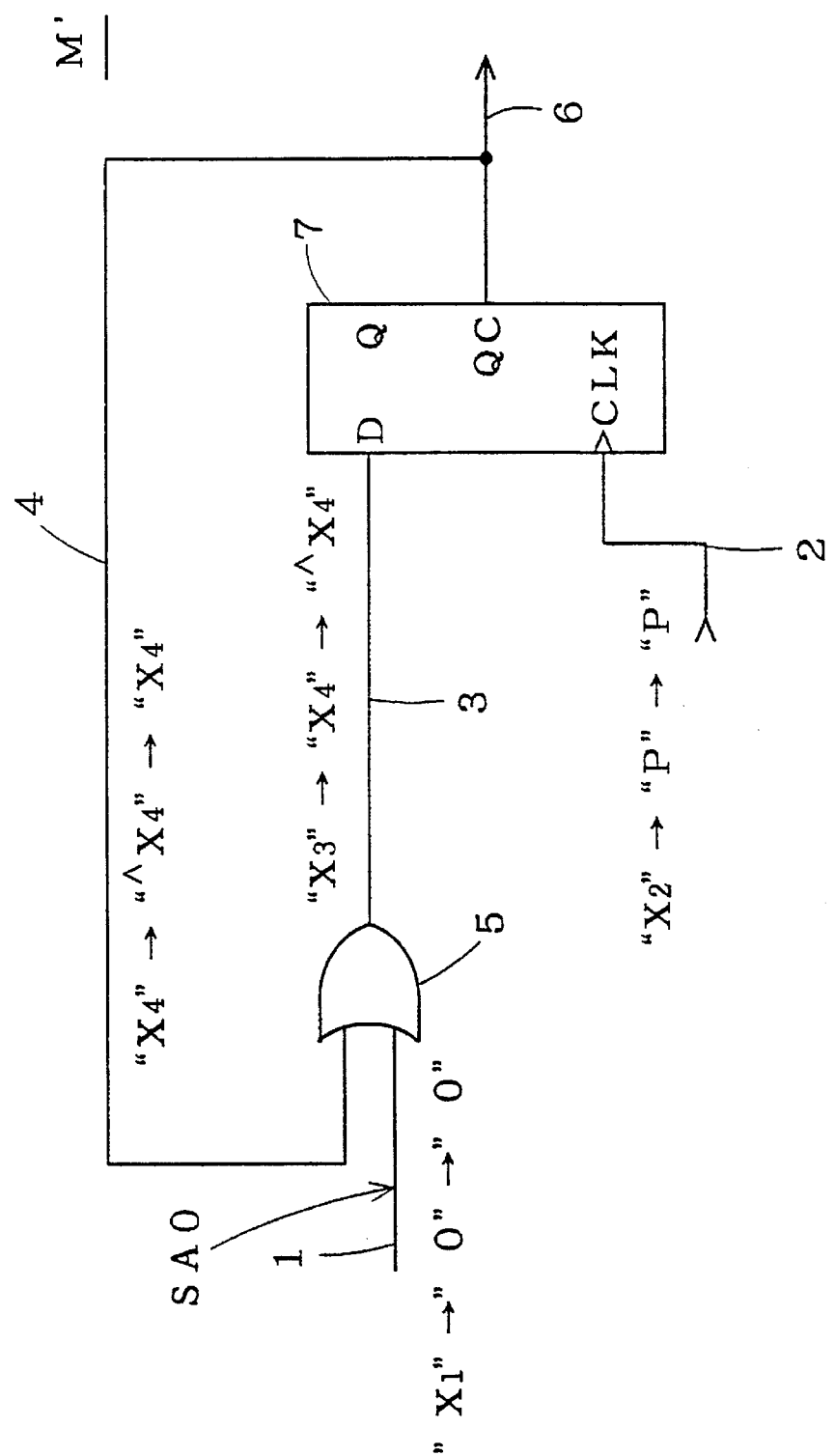
Figure 5:
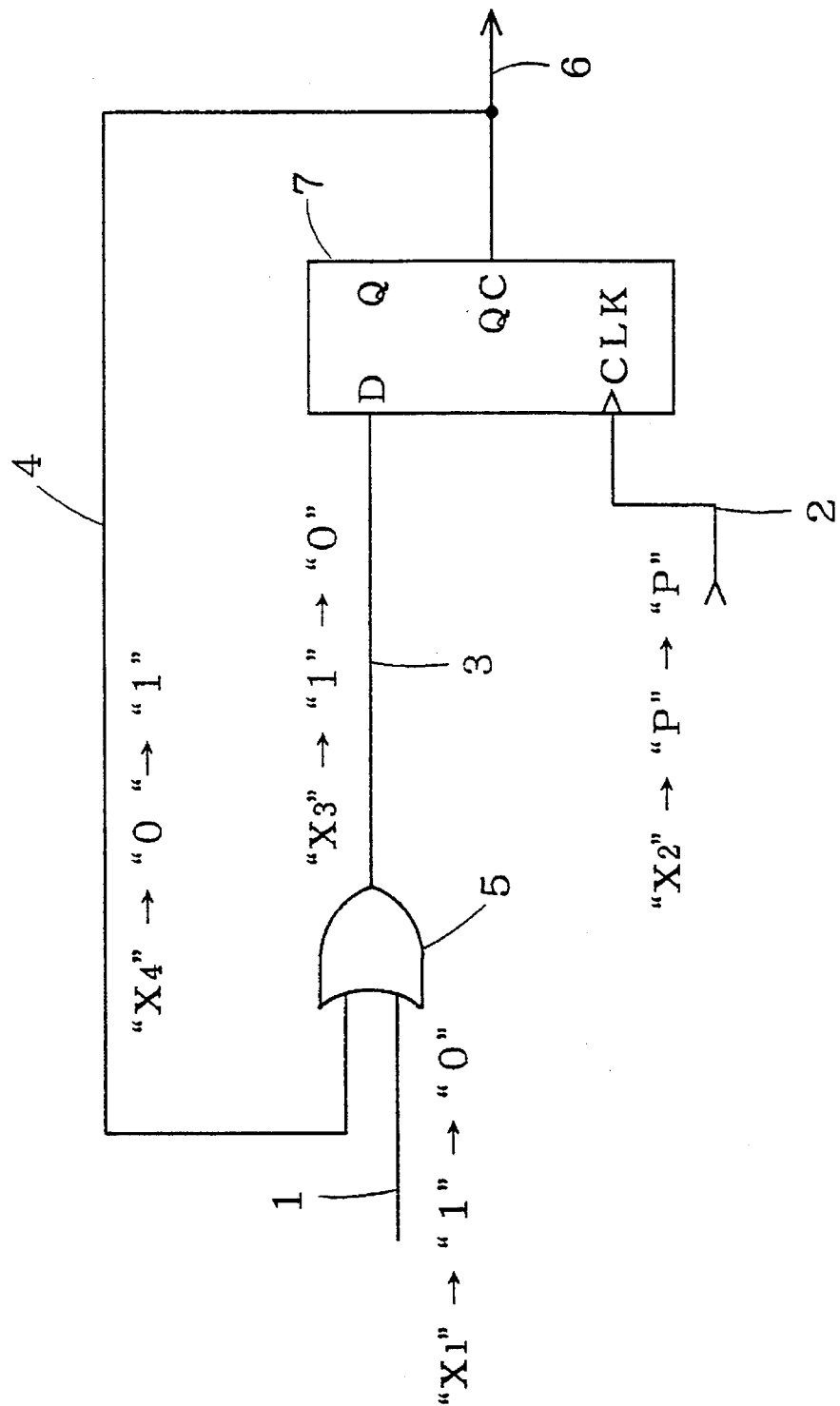

FIGS. 1 and 2 connected to each other at a junction J1 are flow charts cooperatively showing steps of a failure simulation method in accordance with the first preferred embodiment of the present invention. FIGS. 3 to 5 are circuit diagrams illustrating operation of the failure simulation method in accordance with the first preferred embodiment of the present invention. The circuits of FIGS. 3 to 5 each have the same elements and connections as those of FIGS. 24 to 27.

In the step S11, for the purpose of testing a circuit M, a circuit M' with an assumed failure C is prepared. FIGS. 3 and 4 show the circuits M and M', respectively. Now, the failure of the signal line 1 stacked at 0 (SA0) is chosen as the failure C. It is noteworthy that the background art failure simulation method can not determine the capability of test vectors to detect failure of the signal line stacked at 0.

In the step S12, specific values $X_1$ to $X_n$ are set to all of the signal lines $L_1$ to $L_n$, respectively, only in the circuit M' or both in the circuits M and M'. After description as to the case where the specific values are set both in the circuits M and M', it will be discussed that the specific values need not be set in the circuit M.

In FIGS. 3 and 4, the specific values $X_1$ to $X_4$ are set to the signal lines 1 to 4, respectively. Since the signal line 6 always propagates the same value as the signal line 4, no specific value is set thereto.

The undefined value "X" used in the background art failure simulation method represents a value of which logic is undefined, and has a possibility of being between logic "0" and "1". On the other hand, each of the specific values $X_1$ to $X_n$ generally represents a logical value of either "0" or "1". Thus, the setting of the specific values makes a significant difference between the first preferred embodiment and the background art.

In the next step S13, the same test vector F is applied to respective specified signal lines $L_j$ ($1 \leq j \leq n$) in the circuits M and M'. The test vector is now applied to one signal line in each of these circuits M and M'. The first test vector value "1" is applied to the signal line 1 prior to the propagation of the first "P" on the signal line 2, and then the second test vector value "1" is applied to the signal line 1 prior to the propagation of the second "P" on the signal line 2. As above, the signal line 1 is chosen as the specified signal line $L_j$.

In the step S14, the value of the test vector F and the specific values $X_1$ to $X_n$ are propagated both in the circuits M and M'. Propagation of the values in the circuit M will be described first referring to FIG. 3. Application of the value "1" of the test vector F changes the value on the signal line 1 from "$X_1$" to "1". Accordingly, the OR gate 5 outputs the value "1" to the signal line 3. When "P" is on the signal line 2, the inverted output end QC of the flip flop 7 outputs "0" to the signal line 4. Although the value "0" propagates on the signal line 4, the OR gate 5 still outputs the value "1" to the signal line 3 to propagate thereon.

After that, the value "1" of the test vector F is applied again to the signal line 1. Of course, the OR gate 5 outputs the same value, and therefore the value "1" still propagates on the signal line 3. When "P" is on the signal line 2, the inverted output end QC of the flip flop 7 outputs "0" to the signal line 4.

From the above propagation, it is found that the same result is obtained, no matter whether the specific values are set in the normal circuit M or not. Thus, in the step S12, it is not always necessary to set the specific values in the circuit M.

Next, propagation of the values in the circuit M' will be described referring to FIG. 4. Although the test vector value "1" of the test vector F is applied to the signal line 1, the value on the signal line 1 with an assumed failure of being stacked at 0 changes from "$X_1$" to "0". Then, the OR gate 5 outputs the value "$X_4$" to the signal line 3. When "P" is on the signal line 2, the inverted output end QC of the flip flop 7 outputs the value "$\overline{X_4}$" to the signal line 4. The bar over a value represents logical inversion of the underwritten value.

In the background art failure simulation method, the value on the signal line 4 is assumed an undefined value "X". Accordingly, the value given to the signal line 3 is also undefined and again the value given to the signal line 4 is still undefined. On the other hand, in the present invention, the signal line 4 is initially provided with a specific value "$X_4$" generally representing either of the logical value "1" or "0", not a logically undefined value. The value given to the signal line 3 is regarded as the general value "$X_4$" and the output value of the flip flop 7 is regarded as "$\overline{X_4}$" when "P" is on the signal line 2.

Propagation of "$\overline{X_4}$" on the signal line 4 causes propagation of "$\overline{X_4}$" on the signal line 3. Since the signal line 1 is assumed to be stacked at 0, the value on the signal line 3 is not changed by application of the next test vector value to the signal line 1. When next "P" is on the signal line 2, the flip flop 7 outputs the value "$X_4$" to the signal line 4.

On completing the above propagation, the value $V_k$ (normal result) on another specified signal line $L_k$ ($1 \leq k \leq n$) in the circuit M and the value $V_k'$ (failure result) on the same signal line $L_k$ in the circuit M' are obtained in the step S15. In FIGS. 3 and 4, the signal line 6 is chosen as $L_k$. The signal line 6 propagates the same value as the signal line 4.

In the circuit M of the FIG. 3, $V_k$ is found to be the sequence of "0", "0" while in the circuit M' of FIG. 4, $V_k'$ is found to be the sequence of "$\overline{X_4}$", "$X_4$".

In the next step S16, judgment is made as to whether $V_k$ and $V_k'$ are in agreement with each other or not. When in agreement, it is found that the failure C can not be detected by the test vector F since there is no difference between the normal result and the failure result due to the failure C (to the step S17). On the other hand, when in disagreement, it is found that the failure C can be detected by the test vector F (to the step S18). In other words, it is judged that the test vector F is capable of detecting the failure C.

Referring to FIGS. 3 and 4, in the circuit M, the two values obtained as the normal result are equal to each other, i.e. "0", while in the circuit M', the two values obtained as the failure result are different (logically opposite to each other). As mentioned before, since the specific value "$X_4$" generally represents either of logical value "1" or "0", "$X_4$" and "$\overline{X_4}$" are necessarily opposite in logical term to each other.

The failure simulation method in accordance with the first preferred embodiment can also determine the capability of test vectors for detecting such a failure of the signal line 1 stacked at 1 as the background art failure simulation method has coped with. Description on the case will follow.

As described in the background art failure simulation method, it is known that the test vector having the values "1", "0" in sequence is capable of detecting the failure. It will be described herein that the failure simulation method in accordance with the first preferred embodiment can also judge that the test vector is capable of detecting the failure of the signal line 1 stacked at 1.

FIG. 5 is a circuit diagram illustrating signal propagation when the signal line 1 is provided with the test vector values "1", "0" in sequence in the normal circuit M. The value on the signal line 1 changes from "$X_1$" to "1", and accordingly the OR gate 5 outputs the value "1" to the signal line 3 regardless of the value on the signal line 4. When "P" is on the signal line 2, the inverted output end QC of the flip flop 7 outputs the value "0" and the signal line 4 propagates the outputted value "0".

Next, the test vector value "0" is given, and then the signal line 3 propagates the value "0". When "P" is on the signal line 2, the inverted output end QC of the flip flop 7 outputs the value "1" and the signal line 4 propagates the outputted value "1". As the result, $V_k$ indicates the values "0", "1" in sequence.

Figure 6:
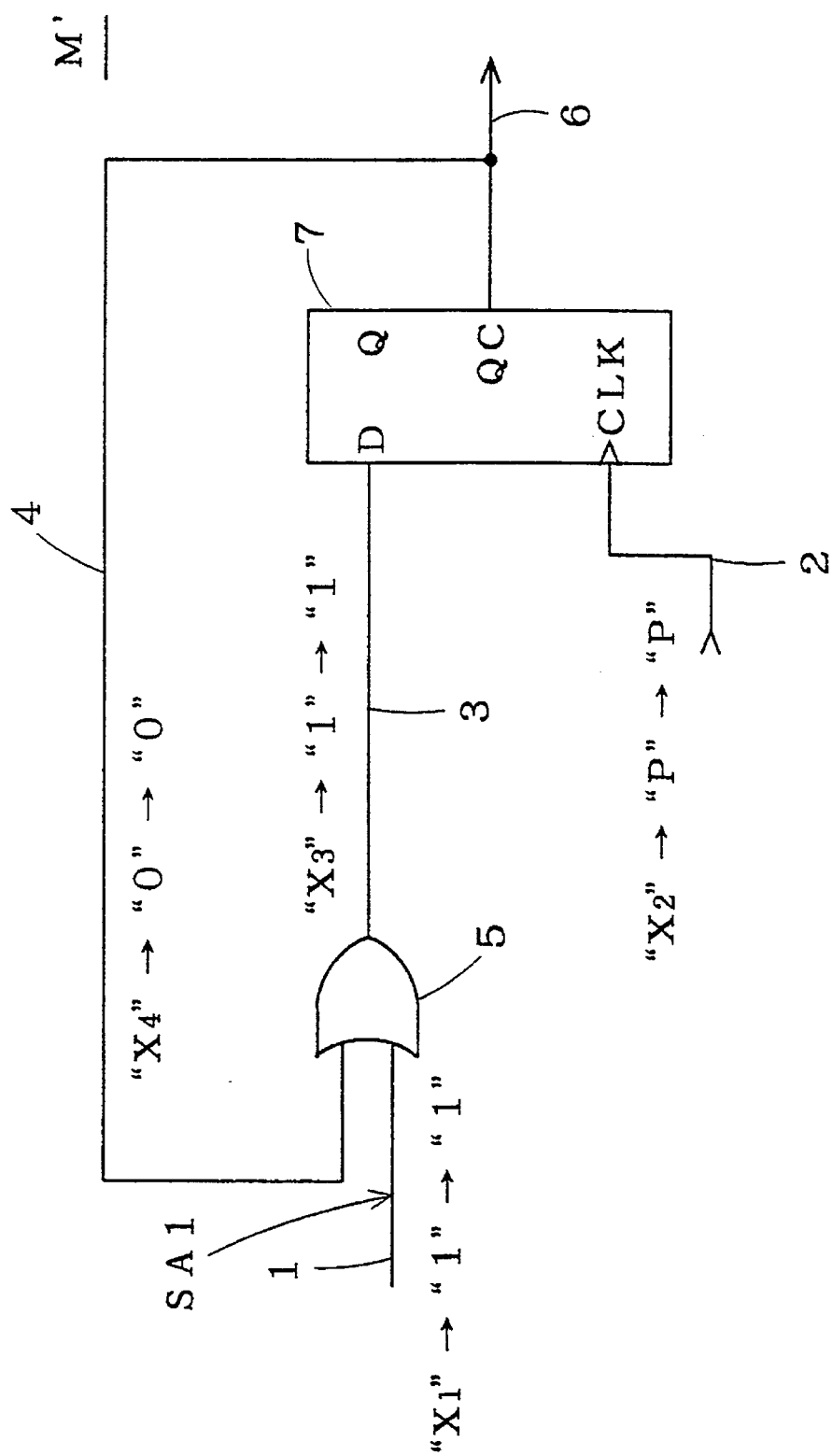

FIG. 6 is a circuit diagram of the circuit M' in which the signal line 1 is stacked at 1, as opposed to the circuit M. Since the signal line 1 is stacked at 1, the signal line 3 propagates the value "1" regardless of the test vector value applied to the signal line 1 and the value on the signal line 4. When "P" is on the signal line 2, the signal line 4 propagates the value "0". The OR gate 5 outputs again the value "1" to the signal line 3 regardless of the test vector value applied to the signal line 1 and the value on the signal line 4. As the result, $V_k'$ indicates the values "0", "0" in sequence.

The values $V_k$ and $V_k'$ are not in agreement with each other, and therefore, it is judged that the test vector ("1", "0") which causes disagreement of the values on the signal line 6 is capable of detecting the failure of the signal line 1 stacked at 1 in the circuit M.

Thus, the failure simulation method in accordance with the first preferred embodiment initially provides the respective signal lines with the specific values each of which generally represents the logical value "1" or "0" and performs the propagation of the test vector and the specific values, thereby determining the capabilities of the test vectors for detecting the failures both in the cases the background art failure simulation method has addressed and has in the cases the background art failure simulation method not addressed.

The Second Preferred Embodiment

According to the failure simulation method of the first preferred embodiment, it becomes possible to determine the capability of the test vector to detect a failure that the background art failure simulation method can not detect. From another point of view, the background art failure simulation method can determine the capability of the test vector for detecting a specific failure in a specific circuit, without the first preferred embodiment.

Determining in advance whether or not the failure needs the setting of the specific values and then deciding whether to set the specific values will make it simpler to judge the capability of the test vector.

Figure 7:
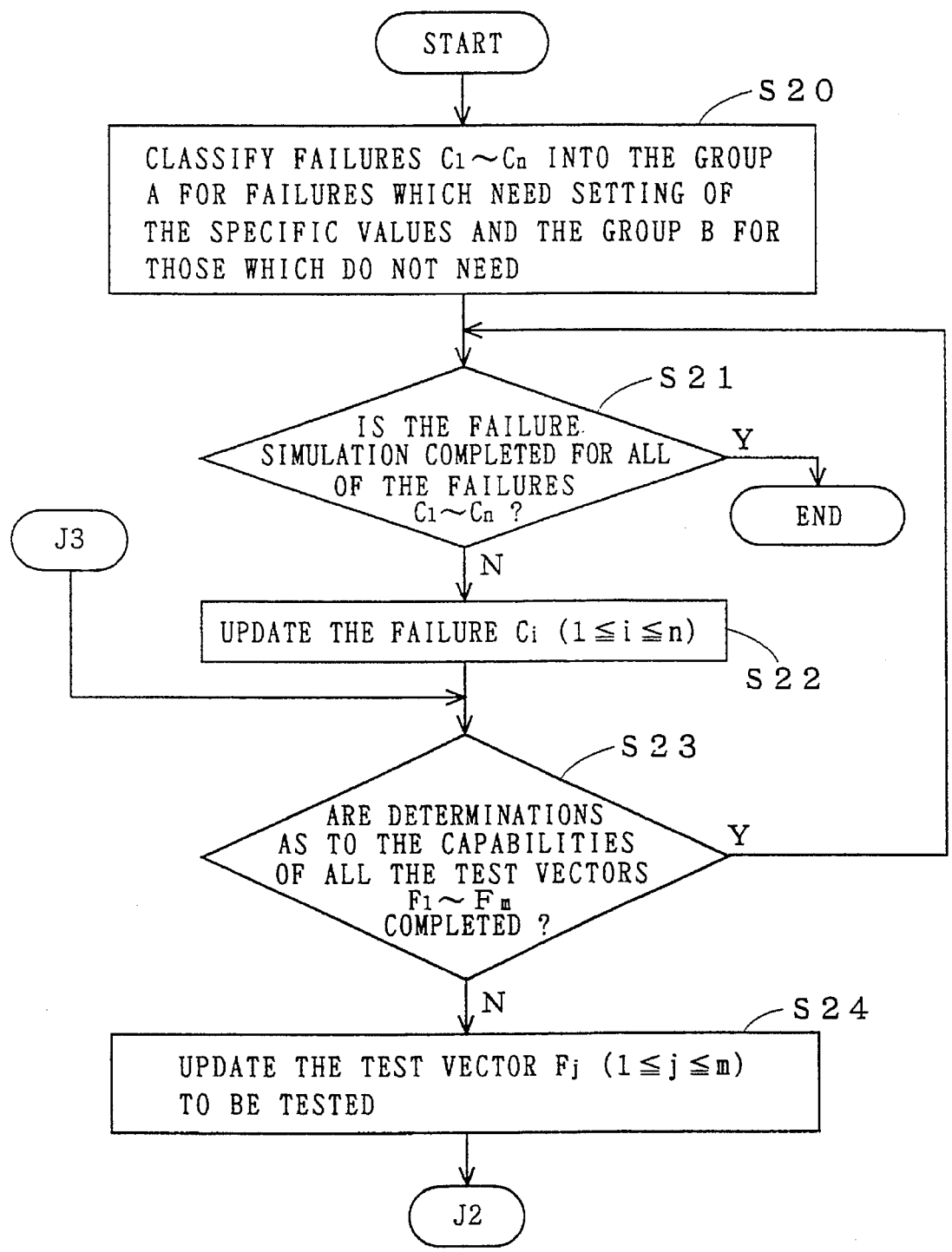
FIGS. 7 and 8 are flow charts cooperatively showing a second preferred embodiment of the present invention.
Figure 8:
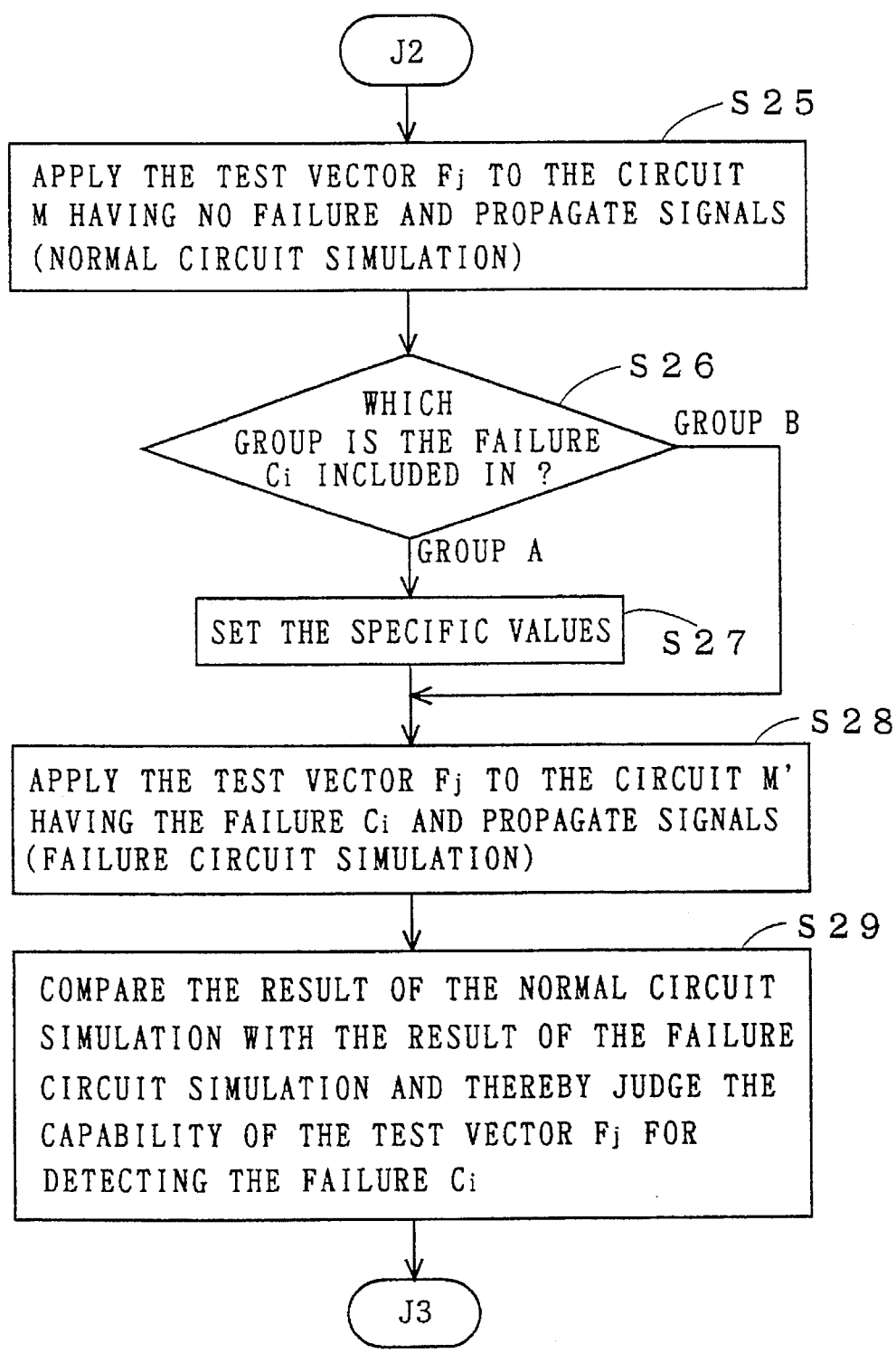

FIGS. 7 and 8 connected to each other at a junctions J2 and J3 are flow charts cooperatively showing steps of a failure simulation method in accordance with the second preferred embodiment of the present invention.

First, in the step S20, failures assumed in the circuit M are classified into two groups A and B. The group A includes failures which need the setting of the specific values and the group B includes those which do not need the setting of specific values. For example, the failure of the signal line 1 stacked at 1 (corresponding here to the failure $C_1$) as shown in FIG. 6 may be included in the group B, and the failure of the signal line 1 stacked at 0 (corresponding here to the failure $C_2$) as shown in FIG. 4 may be included in the group A.

In the next step S21, judgment is made as to whether the failure simulation (described later) is completed for all of the failures. At the initial time, the failure simulation is not performed yet and the step 22 will follow.

In the step S22, an update of the failure to be used for simulation is performed. At the initial time, the failure $C_1$ is chosen to be used for simulation. In the step S23, judgment is made as to whether determinations of the capabilities of all the test vectors for detecting the failure $C_1$ are completed. In the step S24, one of the test vectors is chosen to be used for simulation.

Figure 24:
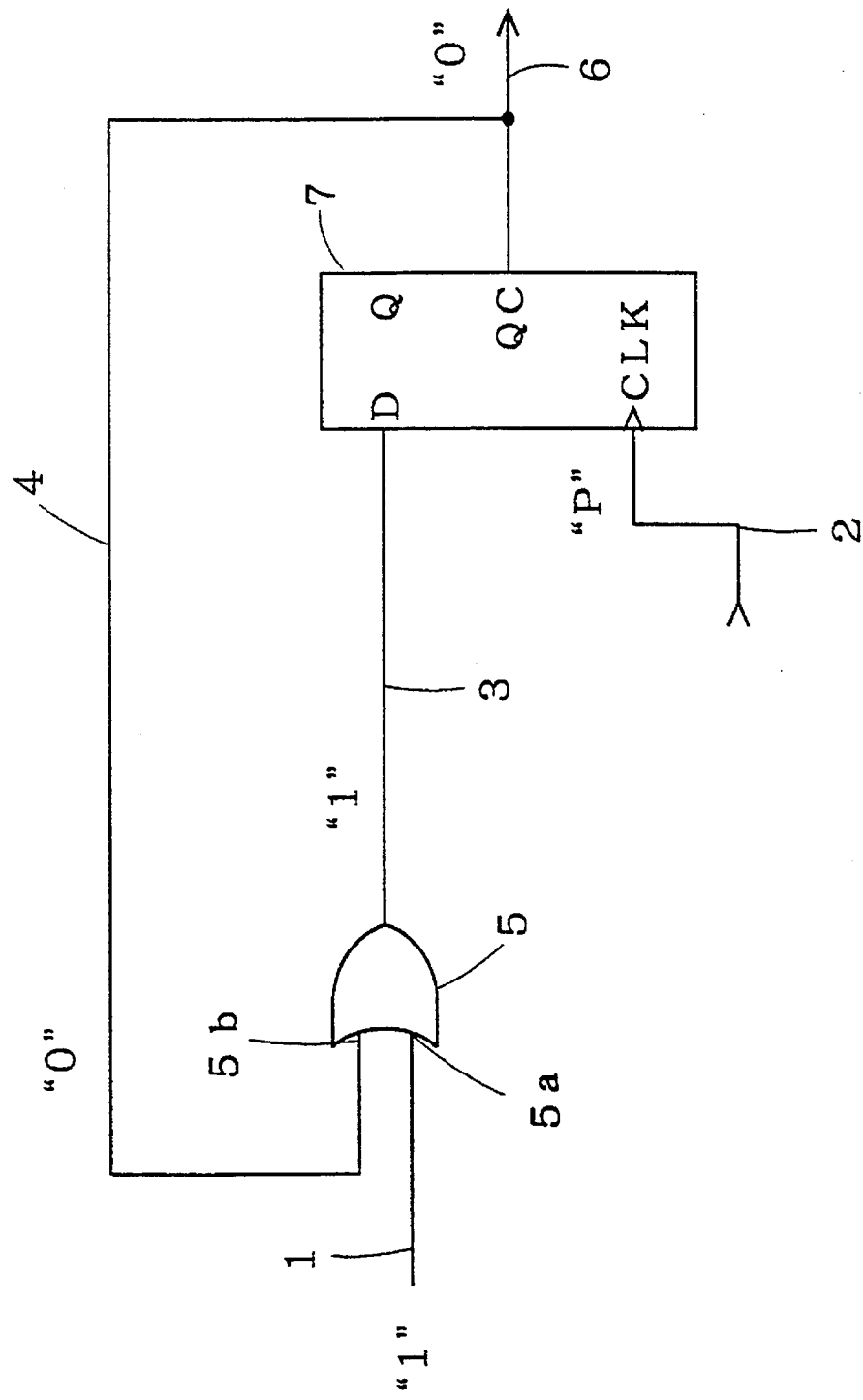
FIGS. 24 to 27 are circuit diagrams illustrating a background art.
Figure 25:
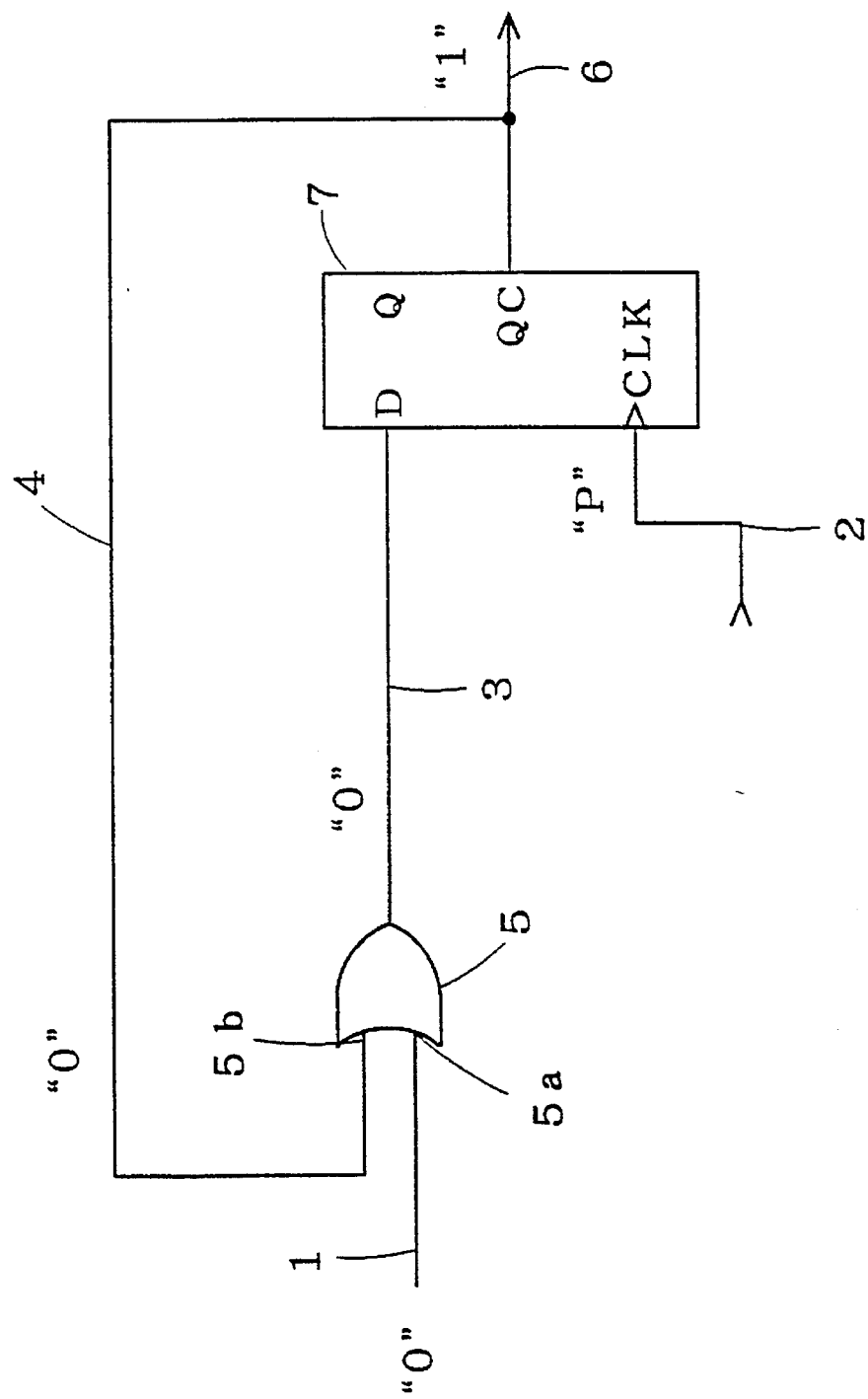

Then, a simulation is performed in the normal circuit. The normal circuit simulation is performed to simulate signal propagation when the test vector is applied to the circuit M without failure. For example, in a case of using the test vector having the values "1", "0" (as the test vector $F_1$), the simulation of the normal circuit is performed as illustrated in FIGS. 24 and 25. As the result, the signal line 6 propagates the values "0", "1" in sequence with timing of propagation of "P" on the signal line 2.

In the step S26, judgment is made as to which group of A and B the failure is included in. If the failure is included in the group A, the specific values should be set in the step S27. Otherwise, it is not necessary to set the specific values. Since the failure of the signal line 1 stacked at 1 is now regarded as the failure $C_1$, it is not necessary to set the specific values.

Figure 26:
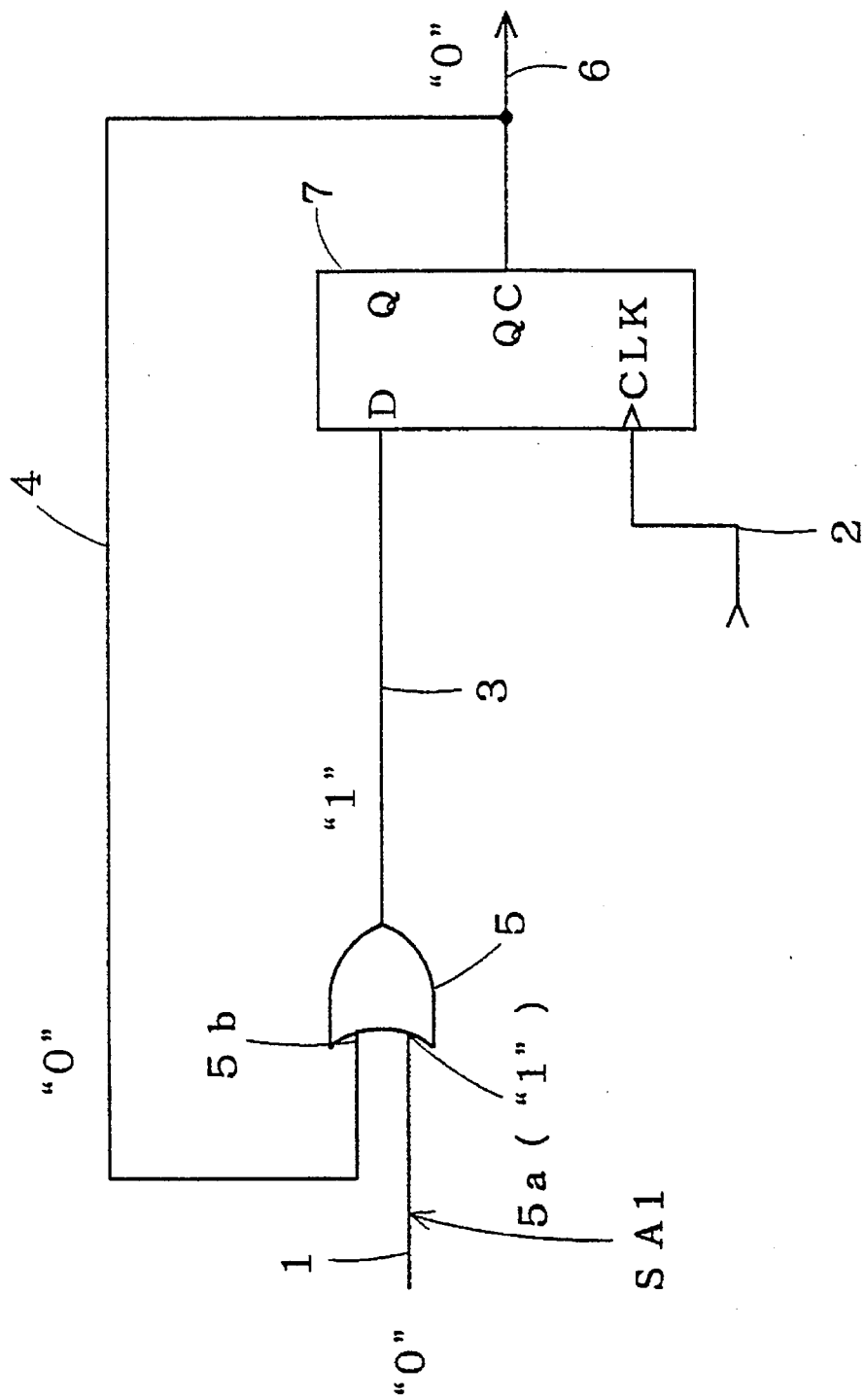
Figure 27:
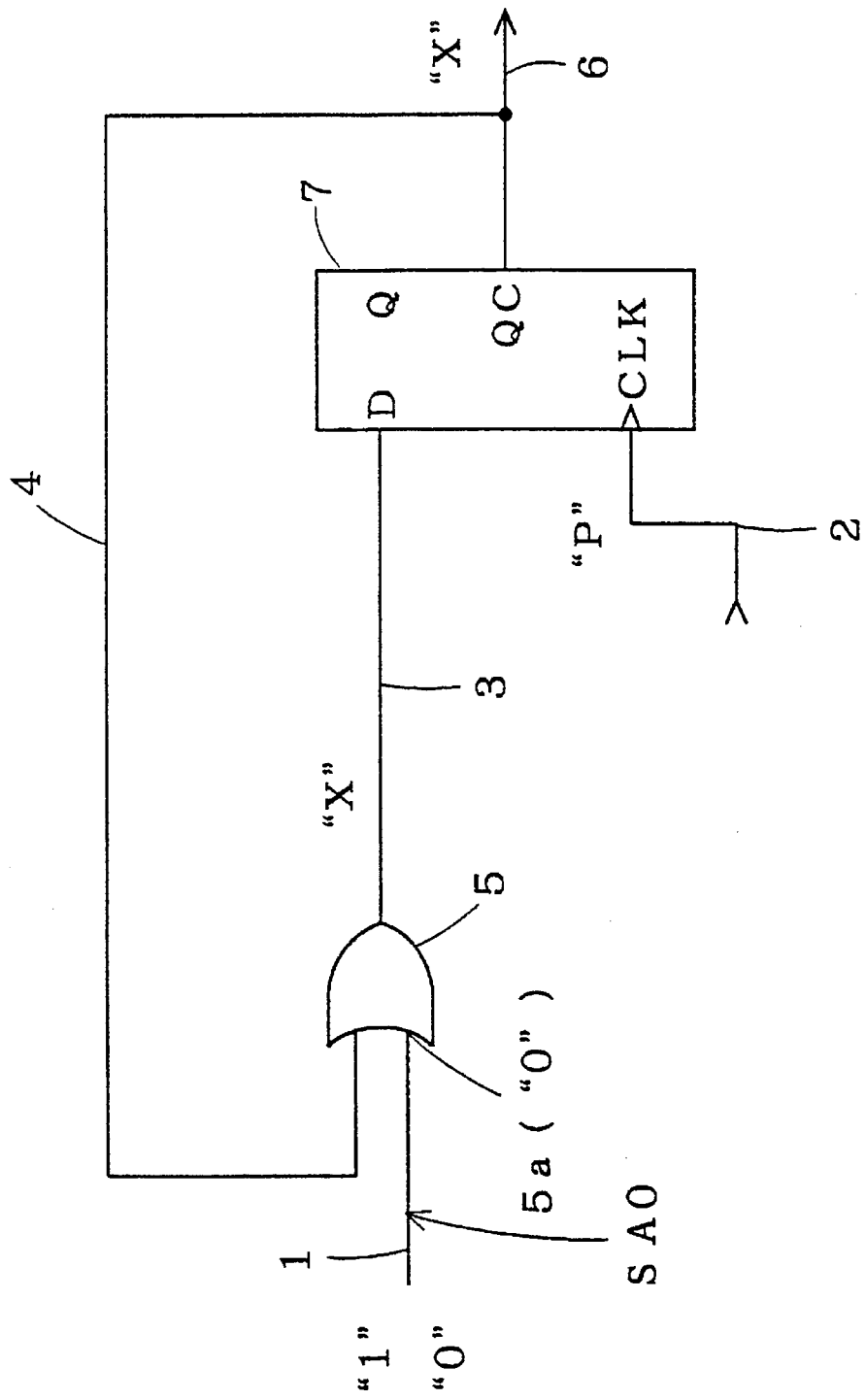

In the step S28, a simulation is performed in a failure circuit as mentioned in the step S21. The failure circuit simulation is performed for simulating signal propagation when the test vector is applied to the circuit M' having an assumed failure. For example, the circuit M' having the failure $C_1$ is shown in FIG. 26. As the result of signal propagation as shown in FIGS. 24 and 26, the signal line 6 propagates the values "0", "0" in sequence.

In the step S29, by comparing the results of the normal circuit simulation with the result of the failure circuit simulation, it is judged whether the test vector to be tested is capable of detecting the present failure or not. In this case, since the result of the normal circuit simulation ("0", "1") and that of the failure circuit simulation ("0", "0") are in disagreement, it is judged that the test vector $F_1$ is capable of detecting the failure $C_1$ in the circuit M, like in the steps S16 and S18 of the first preferred embodiment.

Again from the step S23, the same process as above starts in order to judge the capability of another test vector for detection of the failure $C_1$. In the step S24, for example, the test vector having the sequence of values "1", "1" is chosen as the test vector $F_2$. Then, the result of the step S25 is a sequence of values "0", "0" and the result of the step S28 is also a sequence of values "0", "0". Accordingly, in the step S29, it is judged that the test vector $F_2$ is not capable of detecting the failure $C_1$ in the circuit M.

On completing judgment of all the test vectors for one failure, the step S23 will be followed by the steps S21 and S22. A simulation starts in order to judge the capabilities of the test vectors for detecting another failure.

For example, the failure $C_2$ is chosen to be used for simulation in the step S22. The normal circuit simulation using the test vector $F_1$ is performed in the step S25. As the result, the signal line 6 propagates the values "0", "1" in sequence. In the next step S26, it is found that the failure $C_2$ is included in the group A, and accordingly, the specific values are set in the step S27. The simulation using the test vector $F_1$ is performed in the circuit M' having the failure $C_2$ in the step S28. Since the failure of the signal line 1 stacked at 0 is now regarded as $C_2$, the signal line 6 propagates the values "$\overline{X_4}$", "$X_4$" in sequence regardless of the test vector values as discussed in the first preferred embodiment referring to FIG. 4.

Next, in the step S29, judgment is made as to whether the test vector $F_1$ is capable of detecting the failure $C_2$. Both in the normal circuit simulation and in the failure circuit simulation, the signal line 6 propagates the values in sequence having different logics. Therefore, it is judged that test vector $F_1$ is not capable of detecting the failure $C_2$.

Again from the step S23, the same process as above starts using another test vector. The test vector $F_2$ is chosen to be used for simulation in the step S24, and then the normal circuit simulation using the test vector $F_2$ is performed in the step S25. Applying the values "1", "1" in sequence, the signal line 6 propagates the values "0", "0" in sequence.

In the step S26, it is found that the failure $C_2$ is included in the group A, and accordingly, the specific values are set in the step S27. The simulation using the test vector $F_2$ is performed in the circuit M' having the failure $C_2$ in the step S28. The signal line 6 propagates the values "$\overline{X_4}$", "$X_4$" in sequence regardless of the test vector values as discussed in the first preferred embodiment referring to FIG. 4.

In the normal circuit simulation, the signal line 6 propagates the values having the same logic, while in the failure circuit simulation, the signal line 6 propagates the values having different logics. Therefore, it is judged that test vector $F_1$ is capable of detecting the failure $C_2$ in the step S29.

Thus, according to the second preferred embodiment, the specific values are set only when the failure needs the setting of the specific values to be detected, and are not set when the failure does not need. Therefore, the judgment of the capability of the test vector for detection becomes simpler.

The Third Preferred Embodiment

Figure 9:
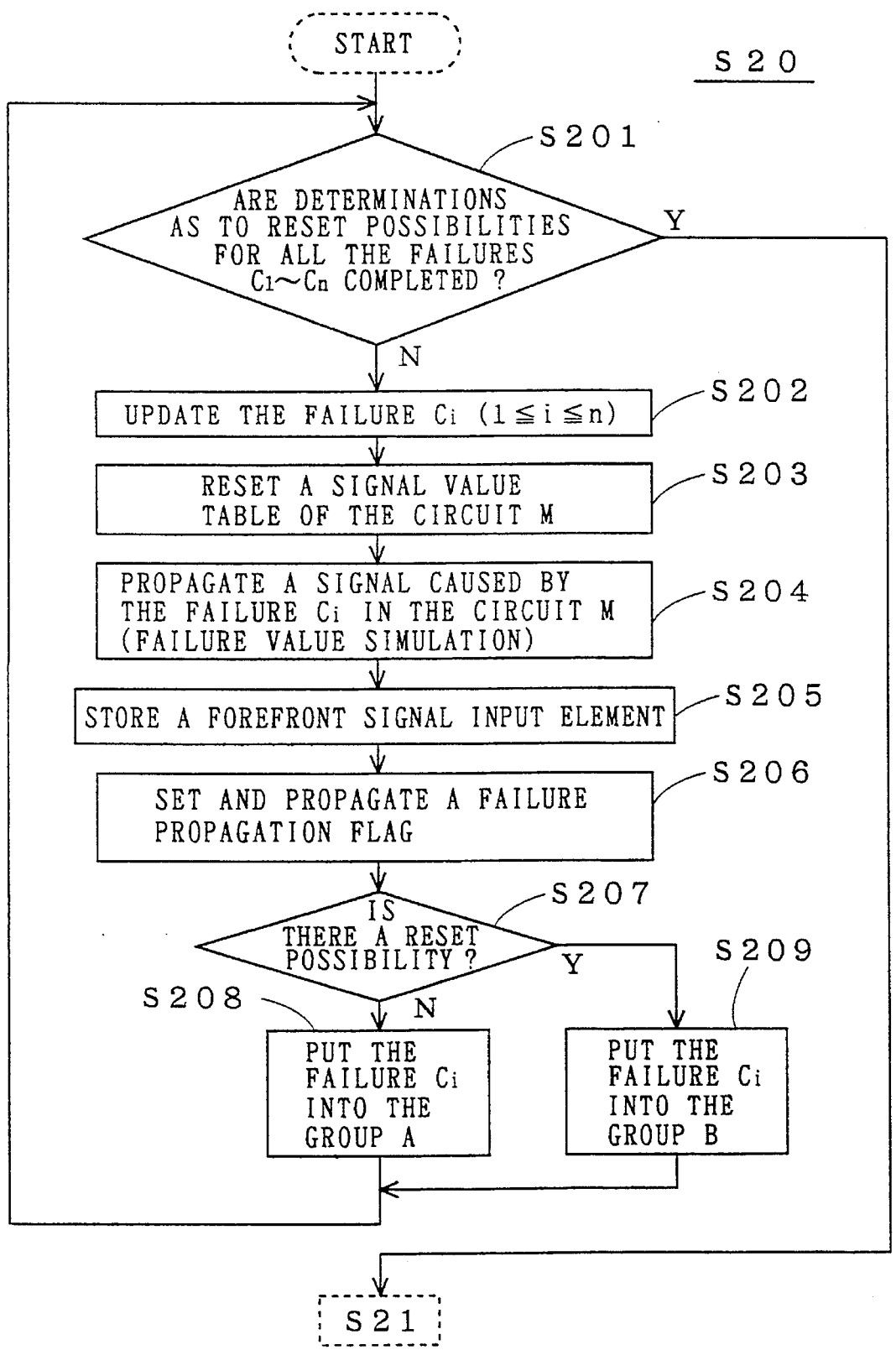
FIG. 9 is a flow chart of a third preferred embodiment.
Figure 10:
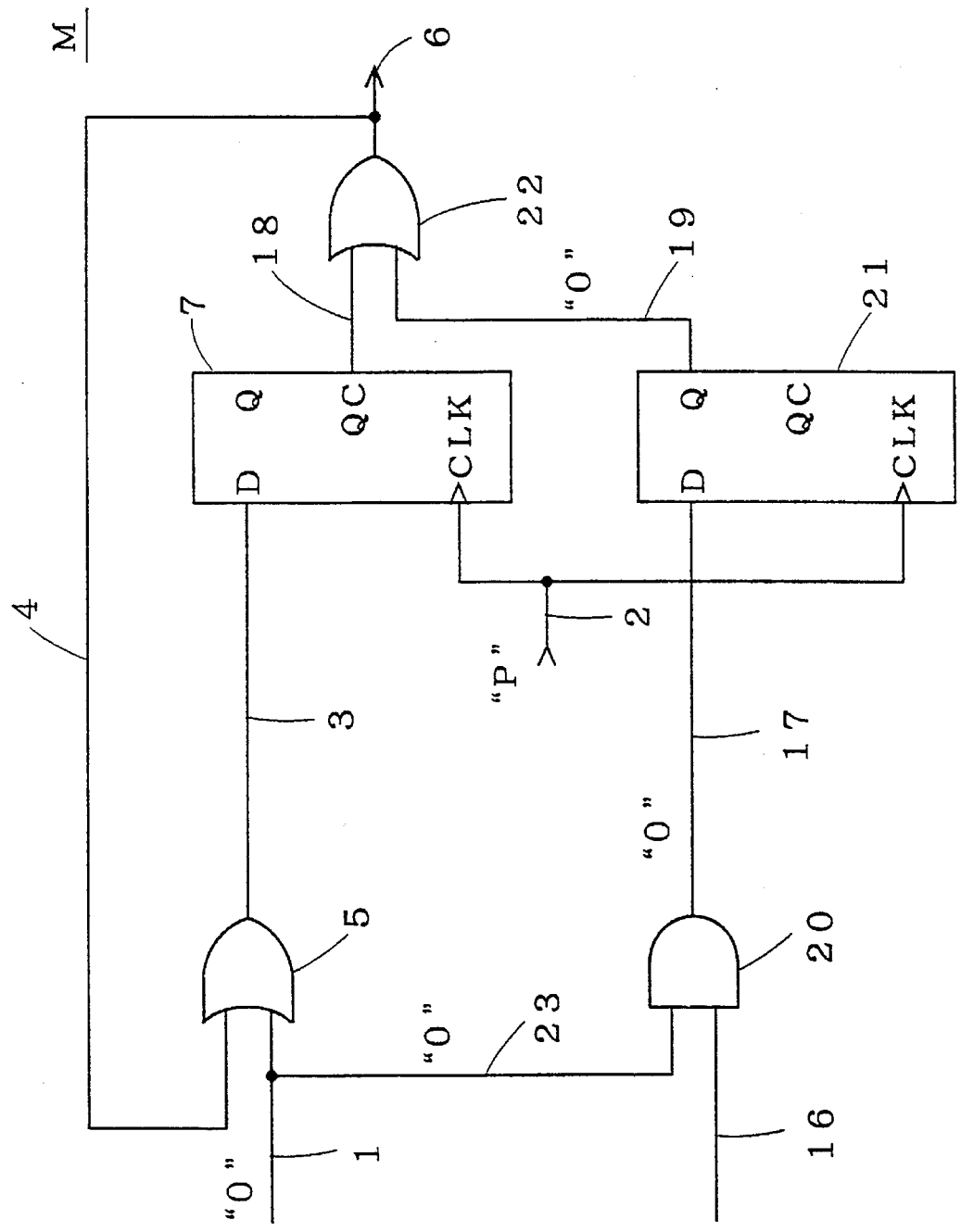
FIGS. 10 and 11 are circuit diagrams illustrating the third preferred embodiment of the present invention.

The third preferred embodiment shows a preferred embodiment of the step S20 discussed in the second preferred embodiment. FIG. 9 is a flow chart showing the details of the step S20. FIG. 10 is a circuit diagram showing the configuration of a circuit M referred to in discussing the procedure of the step S20. For simple discussion, the circuit M of the third preferred embodiment is different from that of the first and second preferred embodiment.

In FIG. 10, the circuit M comprises OR gates 5 and 22, flip flops 7 and 21 and an AND gate 20. The OR gate 5 receives the values from the signal lines 1 and 4 and outputs a logical sum of the received values to the signal line 3. The AND gate 20 receives the values from signal lines 16 and 23 and outputs a logical product of the received values to a signal line 17. The OR gate 22 receives the values from signal lines 18 and 19 and outputs a logical sum of the received values to the signal line 6. The flip flop 7 has the input end D connected to the signal line 3 and the inverted output end QC connected to the signal line 18. The flip flop 21 has the input end D connected to the signal line 17 and a non-inverted output end Q connected to the signal line 19. The clock inputs CLK of the flip flops 7 and 21 are connected in common to the signal line 2. The signal lines 1 and 23 are connected in common to each other, and the signal lines 4 and 6 are connected in common to each other.

First, in the step S201, judgment is made as to whether determinations of reset possibilities described later for all the failures $C_1$ to $C_n$ are completed. At the initial time, no reset possibility is determined and the step S202 will follow. Then, an update of the failure to be used for simulation among the failures $C_1$ to $C_n$ is performed, the reset possibility for each failure is determined. The failure of the signal line 1 stacked at 0 is now chosen as the failure $C_1$.

In the next step S203, a signal value table for the circuit M is reset. The signal value table holds the values propagating on the respective signal lines. The reset of the signal value table means resetting all of the values on the signal lines. Specifically, at this time, no logic (no specific value) is set to each of the signal lines.

In the step S204, a failure value simulation is performed. The failure value simulation is performed by propagating only a signal caused by the present failure. Furthermore, propagation of "P" as a clock signal is also performed.

The failure value simulation will be described specifically taking a case of the failure $C_1$. Since the signal line 1 is stacked at 0, the signal line 23 connected in common thereto propagates the value "0".

The AND gate 20 outputs the value "0" to the signal line 17 regardless of the value on the signal line 16. When "P" is on the signal line 2, the non-inverted output end Q of the flip flop 21 outputs the value "0" to the signal line 19. Then, the simulation of signal propagation can not further proceed.

The reason is as follows. The value given to the signal line 3 by the OR gate 5 depends upon the value on the signal line 4. In the step S203, no value is given to the signal line 4, and accordingly, the value on the signal line 3 can not be determined. In consequence, the value given to the signal line 18 through the inverted output end QC of the flip flop 7 also can not be determined. Therefore, the value given to the signal lines 4 and 6 by the OR gate 22 can not be determined.

After the signal propagation, the element from which the signal can not further propagate is stored as a forefront signal input element (in the step S205). In this case, the OR gate 5 which inputs the value through the signal line 1 and the OR gate 22 which inputs the value through the signal line 19 are forefront signal input elements.

Figure 11:
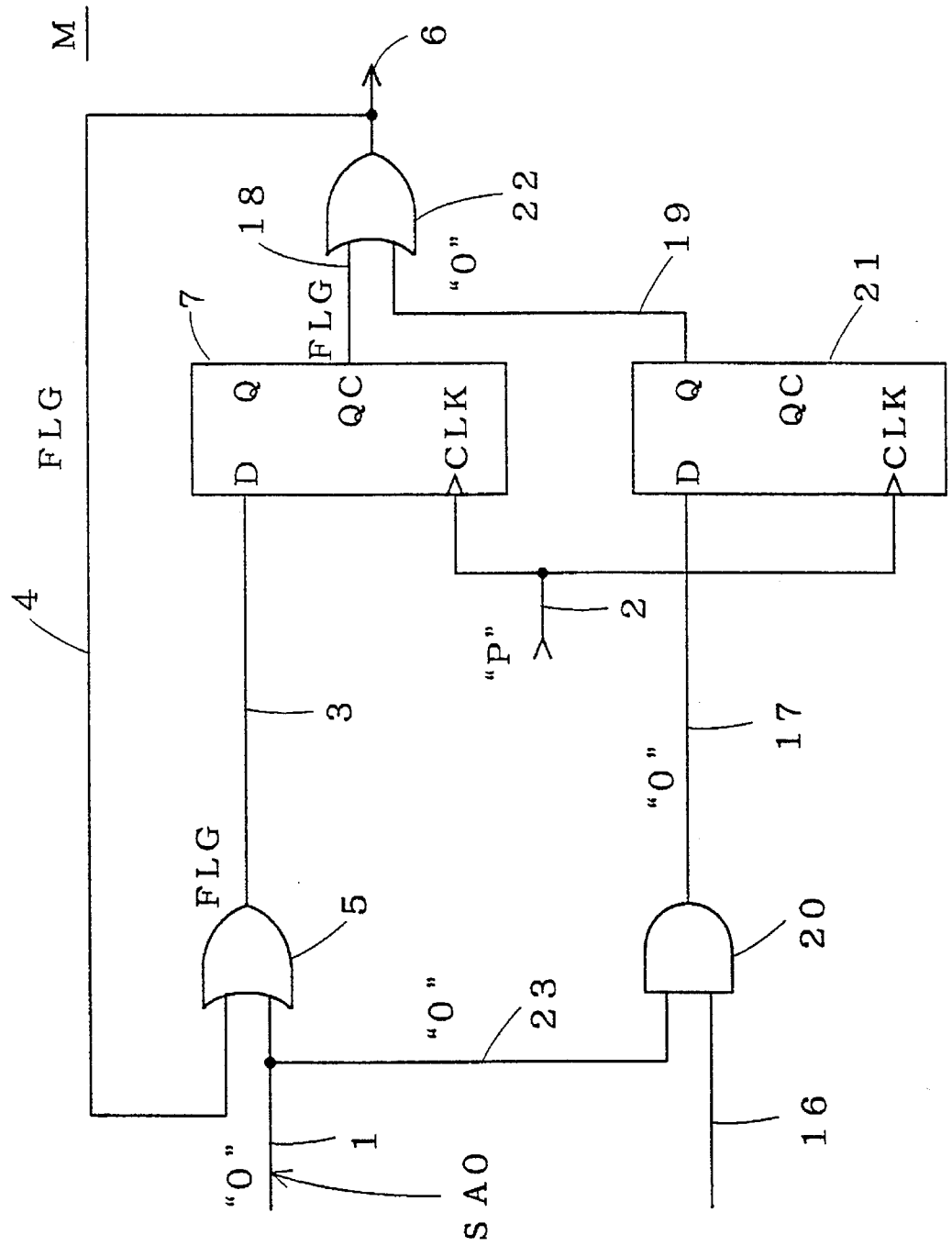
Figure 12:
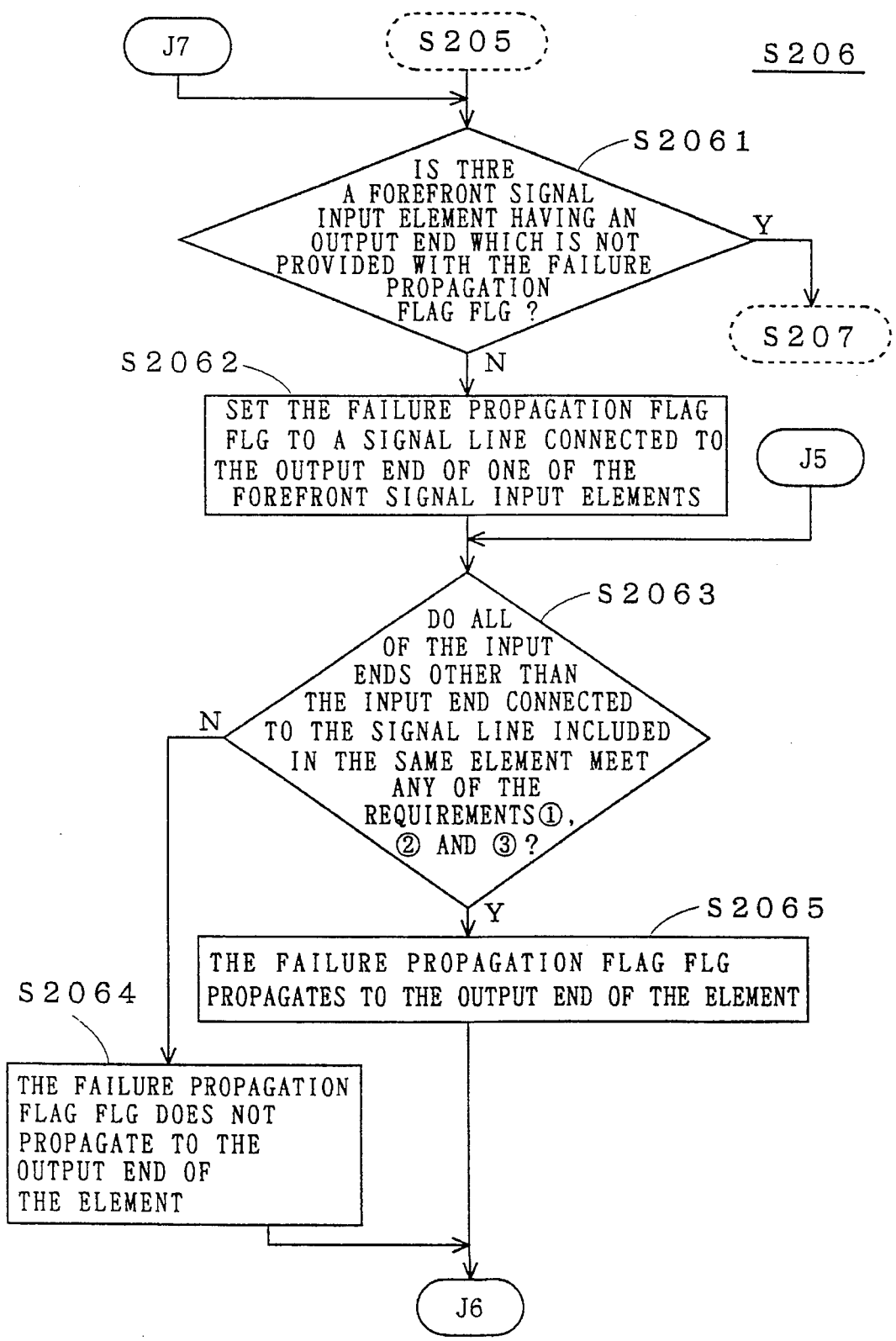
FIGS. 12 and 13 are flow charts cooperatively showing the third preferred embodiment of the present invention.
Figure 13:
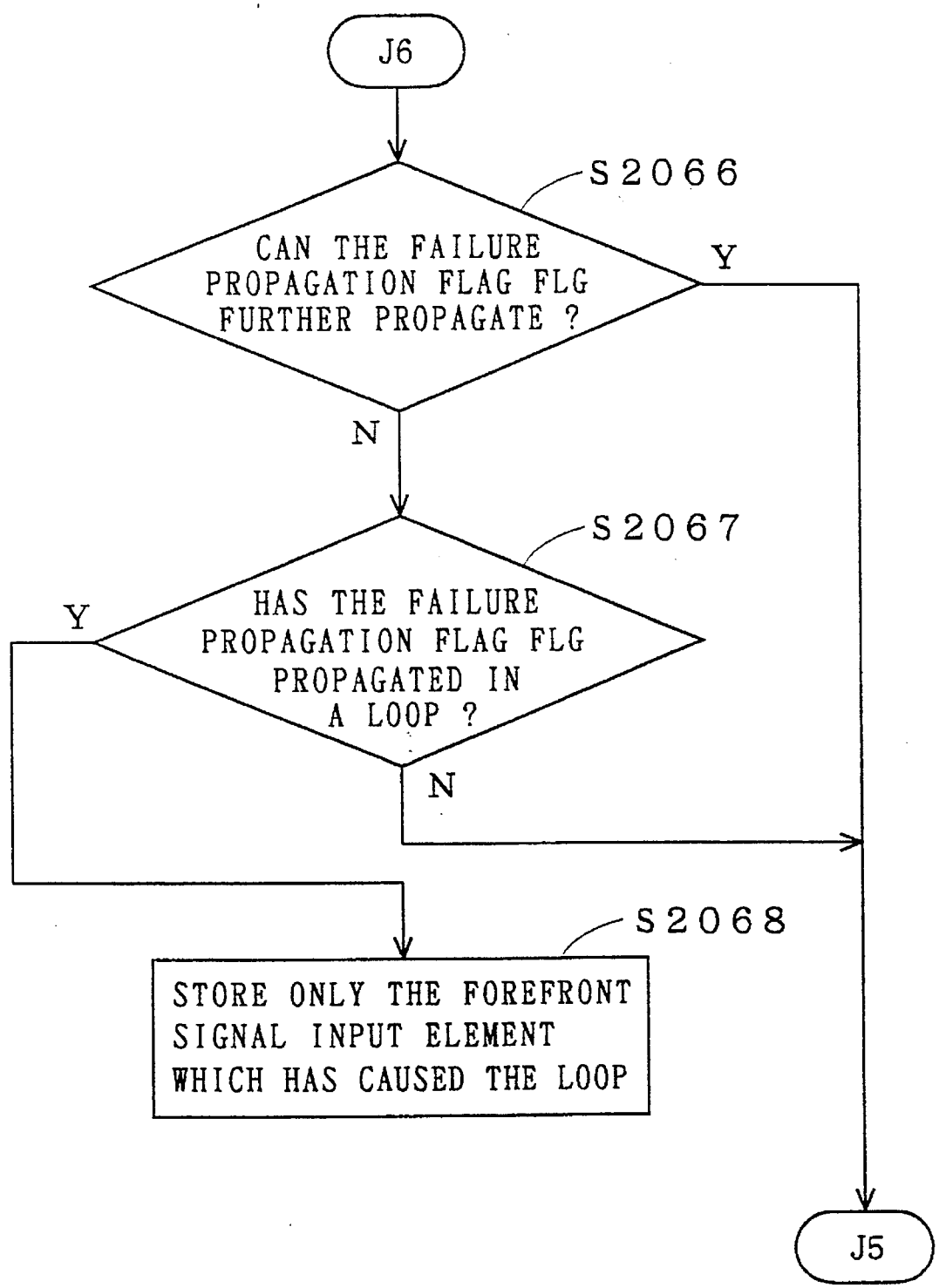

In the next step S206, setting and propagation of a failure propagation flag is simulated. FIG. 11 is a circuit diagram showing the setting of the failure propagation flag. FIGS. 12 and 13 connected to each other at a junctions J5, J6 and J7 are flow charts cooperatively showing the details of the step S206.

First, in the step S2061, judgment is made as to the presence of forefront signal input element having an output end to which the failure propagation flag FLG is not applied. If all of the output ends of the forefront signal input elements are provided with the failure propagation flags FLG, the step S207 will follow. At the initial time, no failure propagation flag FLG has been applied and the step S2062 will follow.

In the step S2062, the failure propagation flags FLG are applied to the signal lines which are connected to the output ends of the forefront signal input elements (in this case, the signal lines 3 and 6 connected to the output ends of the OR gates 5 and 22, respectively). At first in the step S2062, the failure propagation flag FLG is applied to the signal line connected to the output end included in one of the forefront signal input element. The failure propagation flag FLG is now applied to the signal line 3.

In the step S2063, the failure propagation flag FLG propagates through some of the elements only when all of the input ends other than the input end to which the failure propagation flag FLG has been applied meet any of the following requirements:

① the value is not determined;

② another failure propagation flag FLG has already propagated, and

③ a non-controlling value (by which the element can not uniquely determine its output value) is applied thereto.

The propagation of the failure propagation flag FLG is completed not only when the failure propagation flag FLG does not further propagate in the circuit M but also when the failure propagation flag FLG has propagated in a loop through the circuit M (in the step S2066 or S2067).

In this case, the failure propagation flag FLG is applied first to the signal line 3. The failure propagation flag FLG propagates to the input end D of the flip flop 7, and "P" is applied to the clock end CLK thereof through the signal line 2. The clock end CLK of the flip flop 7 meets the requirement ③. Therefore, the failure propagation flag FLG is also given to the signal line 18 through the flip flop 7.

Through the signal line 18, the failure propagation flag FLG propagates to the one input end of the OR gate 22. The other input end of the OR gate 22 is provided with the value "0" through the signal line 19 in the step S204. The OR gate 22 can not uniquely determine its output value by the value "0" applied thereto. In other words, the value "0" is a non-controlling value, and accordingly, the other end of the OR gate 22 meets the requirement ③. Therefore, the failure propagation flag FLG is given to the signal lines 4 and 6.

Since the input end of the OR gate 5 receives the value "0" which is a non-controlling value from the signal line 1, it meets the requirement ③, and therefore, the failure propagation flag FLG is given to the signal line 3.

Thus, the failure propagation flag FLG travels through the circuit in a loop, and thereby the propagation caused by the setting of the failure propagation flag FLG to the signal line 3 is completed. Furthermore, although the OR gate 22 is also a forefront signal input element, setting and propagation of the failure propagation flag FLG from the OR gate 22 is not performed since the signal line 6 has been provided with the failure propagation flag FLG.

As is seen from the requirements ①, ② and ③, there is a possibility that the undefined value "X" may propagate on the portion where the failure propagation flag FLG propagates in a loop. The problem unsolved by the background art results from being impossible to reset the portion where the undefined value "X" propagates. Therefore, it is possible to judge the necessity of setting the specific values as shown in the failure simulation method in accordance with the first preferred embodiment, by determining the reset possibility of the portion where the failure propagation flag FLG propagates in a loop.

In the step S2068, only the gate to cause the loop propagation of the failure propagation flag FLG is stored in a stack and other forefront signal input elements are deleted from the stack. In other words, one forefront signal input element (loop causing element) is stored in the stack with respect to one loop propagation. In this case, since the OR gate 5 is a starting point of the propagation of the failure propagation flag FLG, the OR gate 22 is deleted from the stack.

If the output from the loop causing element can be reset, it is not necessary to set the specific values since the values on the signal lines included in the loop are determined in sequence and propagate. If the output can not be reset, it is necessary to set the specific values since there remains the failure propagation flag FLG in the loop and accordingly there remains the possibility that the undefined value "X" may propagate thereon.

Figure 14:
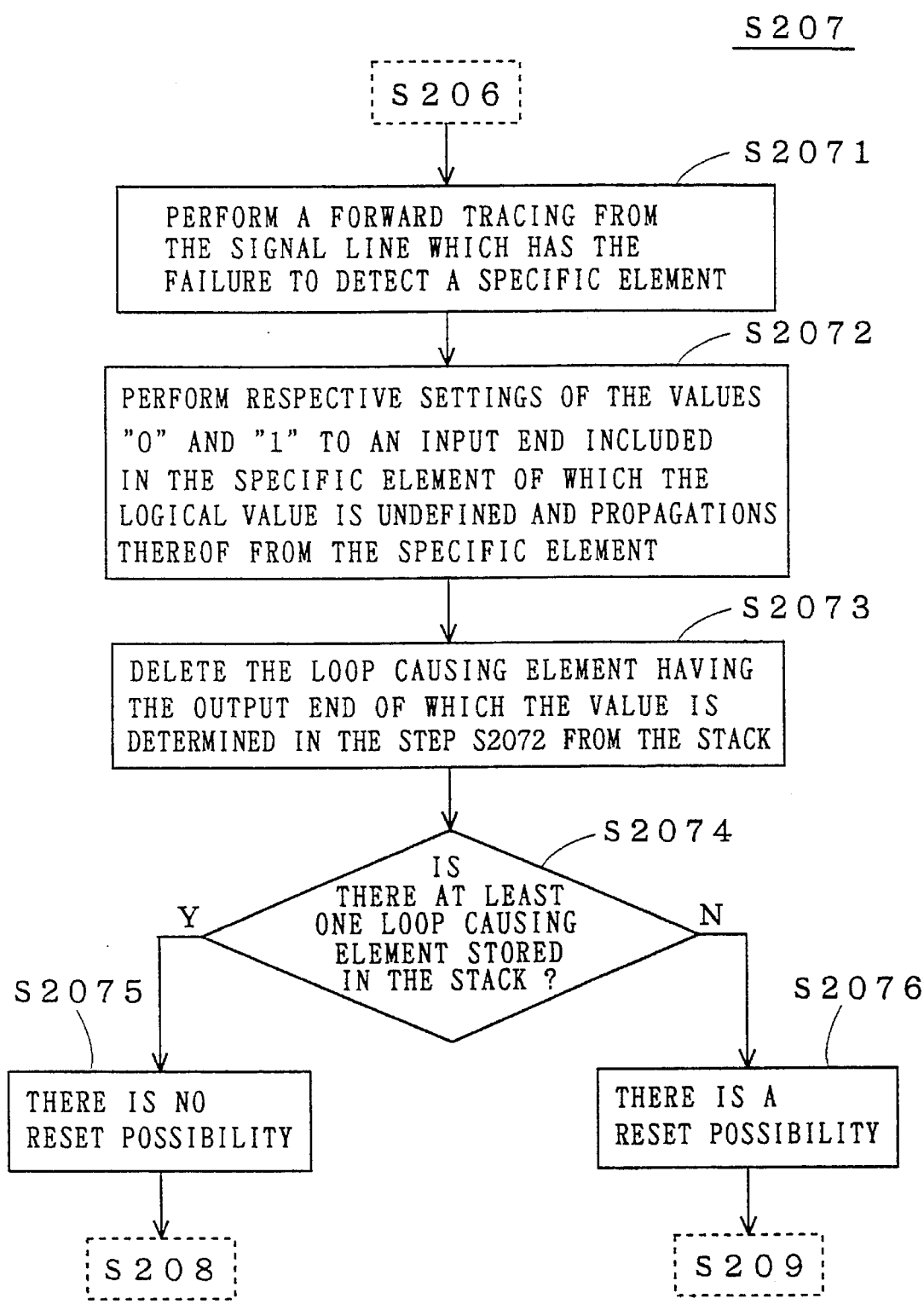
FIG. 14 is a flow chart of the third preferred embodiment of the present invention.

In the step S207, judgment is made as to the reset possibility of the failure propagation flag FLG propagating in a loop. FIG. 14 is a flow chart showing the details of the step S207. First, in the step S2071, detection of a specific element is performed. The specific element refers to an element which has an input end connected to a signal line to which no failure propagation flag FLG is applied and of which the logical value is undefined. The specific element is detected by forward tracing from the signal line 1 which has a failure. The OR gate 5 connected to the signal line 1 is not a specific element since it has the input end provided with the value "0" and the failure propagation flag FLG. The AND gate 20 also connected to the signal line 1 through the signal line 23 is detected as a specific element since it has an input end connected to the signal line 16 which is provided with no value and of which the logical value is undefined.

Figure 15:
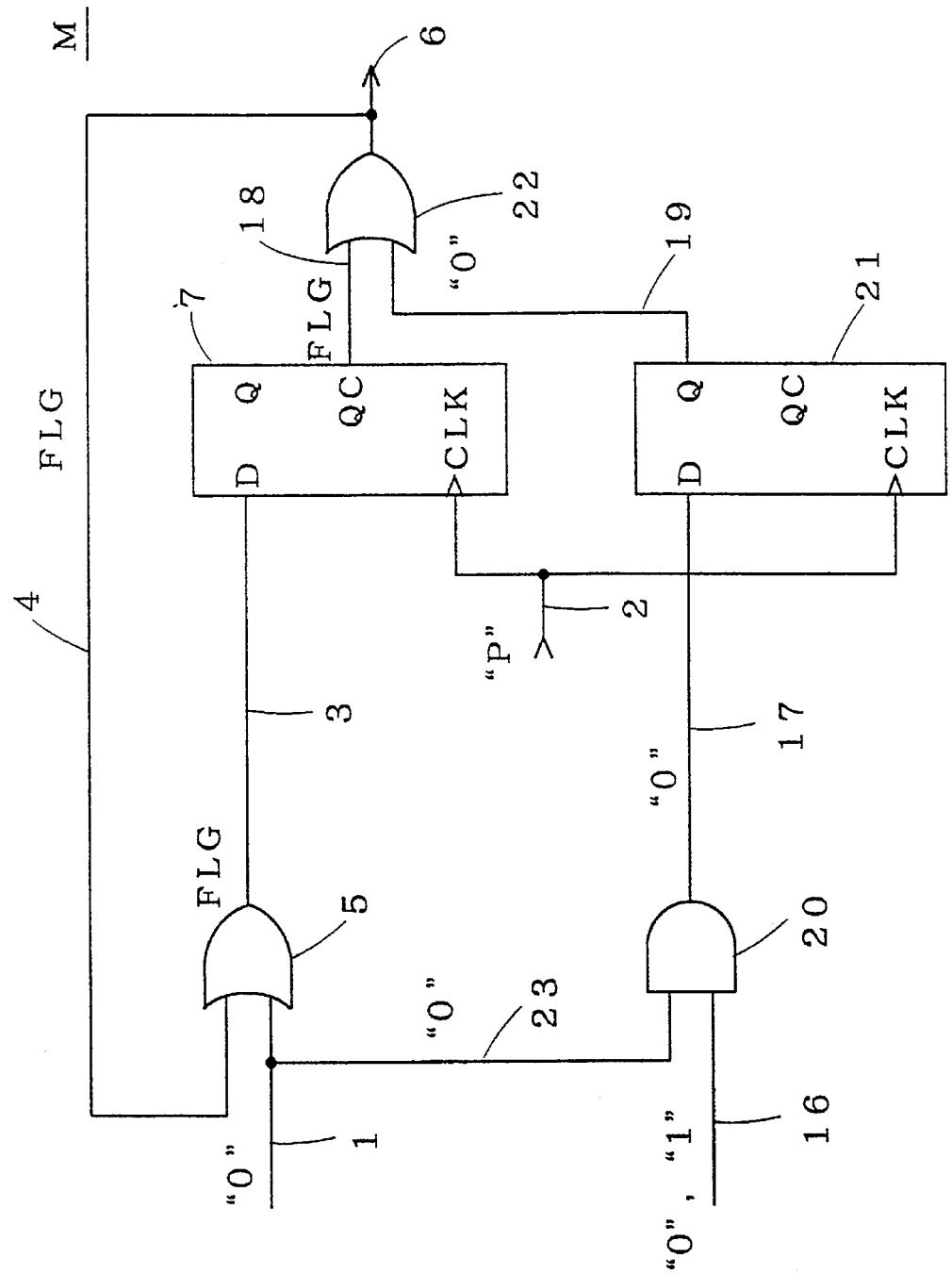
FIGS. 15 to 17 are circuit diagrams illustrating the third preferred embodiment.

In the next step S2072, respective settings of the values "0" and "1" to an input end included in the specific element of which the logical value is undefined and propagations thereof are performed. FIG. 15 is a circuit diagram showing the respective settings of the values "0" and "1" to the signal line 16 and propagations thereof in the circuit of FIG. 11. In this circuit, since the signal line 23 has the value "0", the output end of the AND gate 20 outputs the value "0" to the signal line 17, no matter whether the signal line 16 is provided with the value "0" or "1".

In the step S2073, loop causing elements having output ends of which the value is determined are deleted from the stack. In the circuit of FIG. 15, the OR gate 5 which is a loop causing element has the output end of which the value has not been determined in the step S2072, and therefore, the OR gate 5 remains stored in the stack.

In the step S2074, judgment is made whether at least one loop causing element remains stored in the stack. When not all of the loop causing elements are deleted from the stack in the step S2073 as above, it is judged that there is no reset possibility of the loop (in the step S2075) and the step S208 will follow. On the other hand, if all of the loop causing elements are deleted from the stack in the step S2073, it is judged that there is a reset possibility of the loop (in the step S2076) and the step S209 will follow.

The reason why judgment as to the reset possibility can be made by the judgment made in the step S2074 as to the loop causing element remaining in the stack, followed by the step S208 or S209, is as follows. As mentioned above, there is a possibility that the undefined value "X" may propagate on the portion where the failure propagation flag FLG propagates in a loop. If the value of the output end included in the loop causing element (in this case, the OR gate 5) can be determined by the test vector appropriately selected, there is a reset possibility of the loop propagation of the failure propagation flag FLG.

In other words, if a certain value on the signal line to which any value may be applied (in this case, the signal line 16) can reset the loop propagation of the failure propagation flag FLG, it is judged that the test vector having the certain value is capable of detecting the failure $C_1$. Accordingly, if there is a reset possibility of the propagation loop of the failure propagation flag FLG, an appropriate test vector would be capable of discriminating between a normal circuit and a failure circuit without setting the specific values. Conversely, if there is a reset possibility and a test vector is incapable of discriminating between a normal circuit and a failure circuit, it is judged that the test vector is not appropriate for detecting the failure $C_i$.

Figure 16:
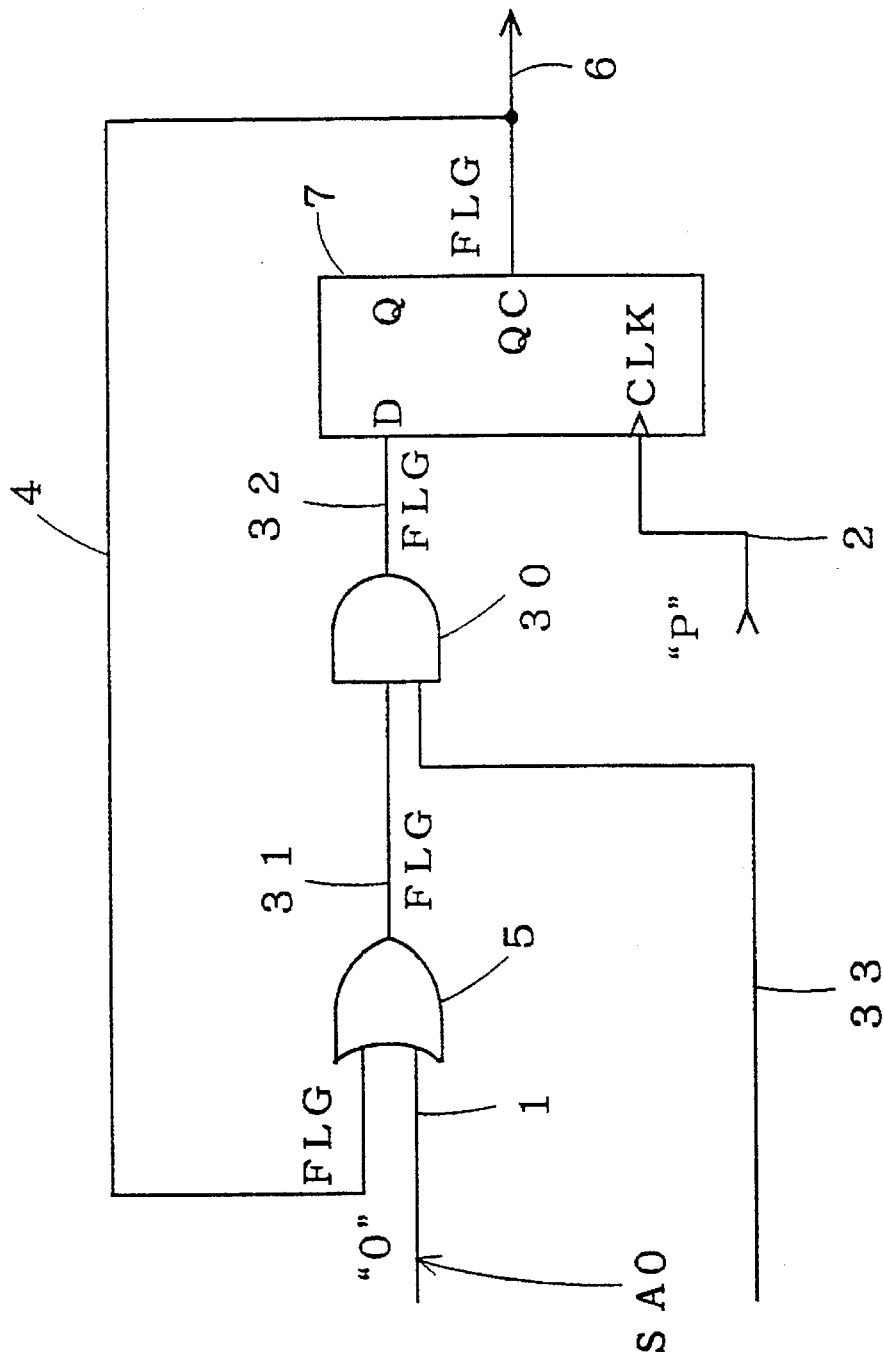
Figure 17:
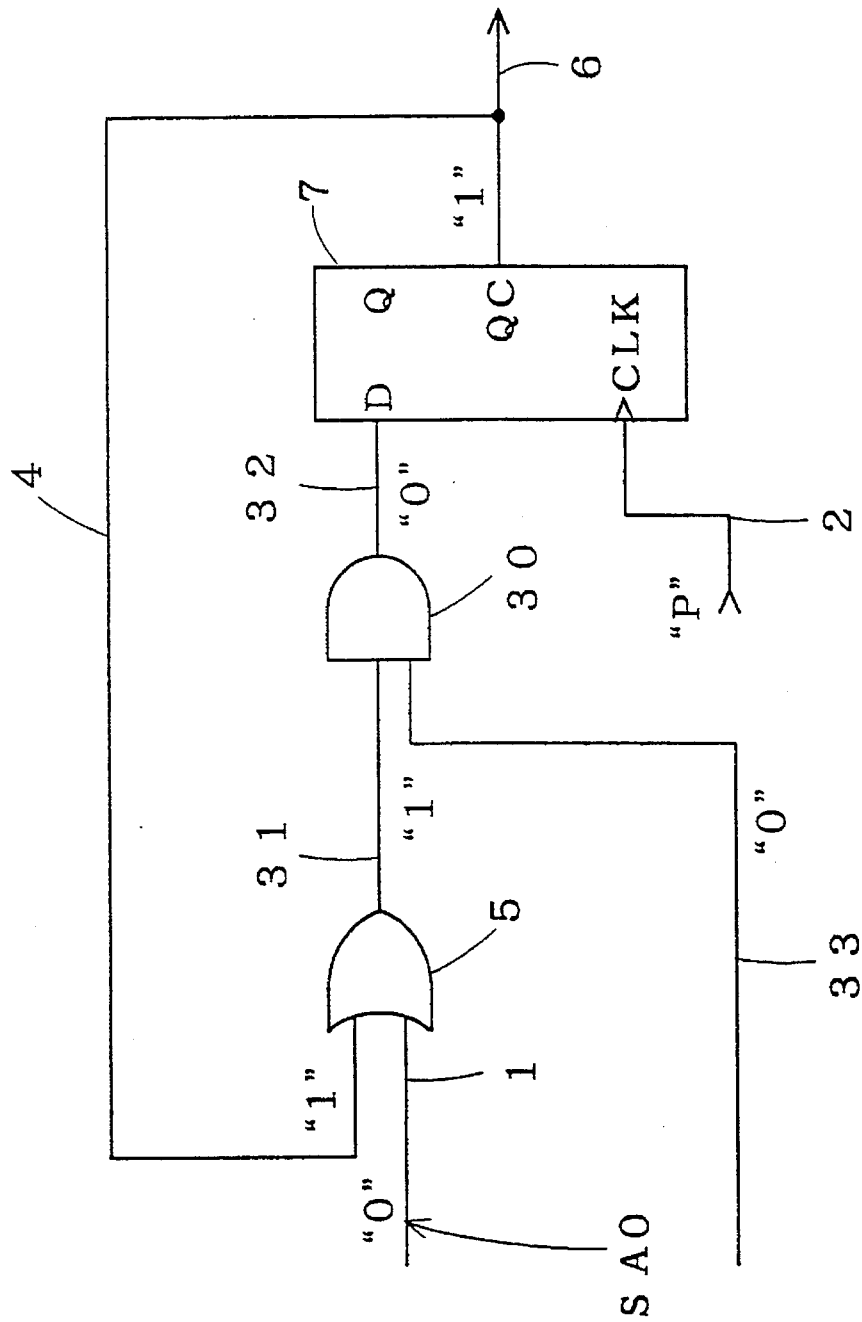

FIGS. 16 and 17 are circuit diagrams showing a circuit in which all of the loop causing elements are deleted from the stack. In these figures, an AND gate 30 is inserted into the signal line 3 of the circuit of FIG. 3. The signal line 3 is divided into signal lines 31 and 32 by the AND gate 30. The AND gate 30 has an input end connected to the signal line 31, another input end connected to the signal line 33 and an output end connected to the signal line 32.

FIG. 16 shows the state at the time when the step S206 is completed. In this figure, the OR gate 5 remains stored in the stack as the loop causing element after the step S2068. In this case, the AND gate 30 is detected as the specific element in the step S2071. In the step S2072, the signal line 33 is provided with the values "0" and "1".

If the value "1" is set to the signal line 33, the output end of the AND gate 30 keeps the failure propagation flag FLG and the value on the signal line 32 is not determined. If the value "0" is set to the signal line 33, as shown in FIG. 17, the output end of the AND gate 30, which is the specific element, outputs the value "0" to the signal line 32, and then the inverted output end QC of the flip flop 7 outputs the value "1" to the signal lines 4 and 6 when "P" is on the signal line 2. Accordingly, the output end of the OR gate 5, which is the loop causing element, outputs the value "1" to the signal line 31.

Thus, in the step S2072, all of the values propagating on the signal lines are determined, and the OR gate 5, which is the loop causing element, is deleted from the stack. Therefore, the step S209 will follow through the step S2076 since the circuit shown in FIGS. 16 and 17 has a reset possibility.

As discussed above, according to the third preferred embodiment, the detailed steps in the step S20 in accordance with the second preferred embodiment are preferably achieved.

The Fourth Preferred Embodiment

In the second and third preferred embodiments, a technique to judge in advance whether the failure needs the setting of the specific values to be detected shown in the first preferred embodiment or does not need shown in the background art. In the case of the failure which needs the setting of the specific values, some signal lines need the setting of the specific values and other signal lines do not.

Figure 18:
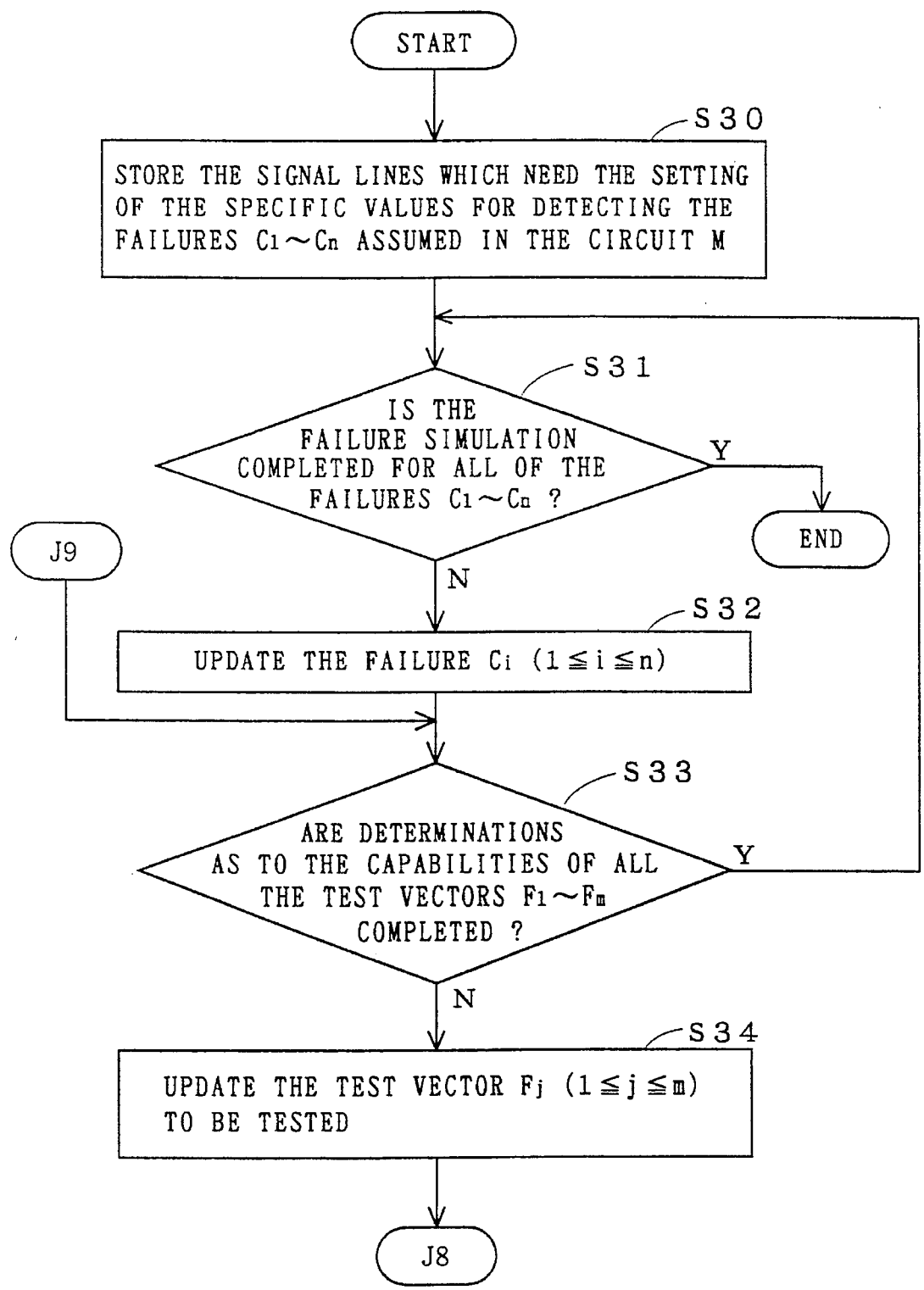
FIGS. 18 and 19 are flow charts cooperatively showing a fourth preferred embodiment of the present invention.
Figure 19:
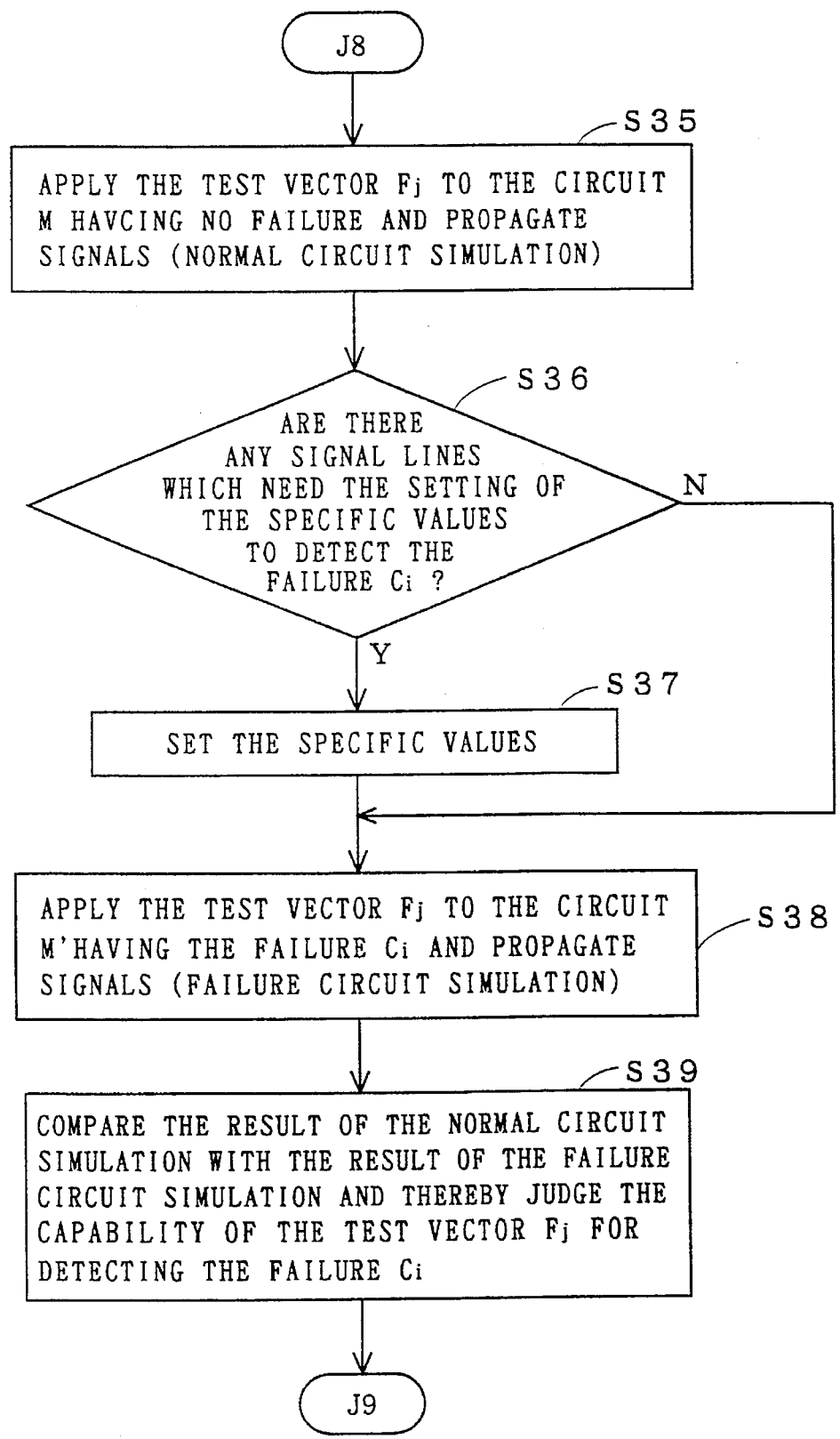

FIGS. 18 and 19 connected to each other at a junctions J8 and J9 are flow charts cooperatively showing the steps of the failure simulation method in accordance with the fourth preferred embodiment.

In the step S30, signal lines which need the setting of the specific values to detect a failure which is assumed in the circuit M are stored. Then, the steps S31 to S35 are carried out in the same way as the steps S21 to S25 of the second preferred embodiment. In the step S36, judgement is made as to the presence of the signal lines which need the setting of the specific values to detect the failure $C_i$. If there are any signal lines stored in the step S30, the specific values are set only to the stored signal lines in the step S37, followed by the step S38. If it is judged in the step S36 that no signal line is stored, the step S38 will follow instead of the step S37 since it is necessary to set the specific values.

The steps S38 and S39 are carried out in the same way as the steps S28 and S29.

Thus, according to the fourth preferred embodiment, the specific values are set only to the signal lines which need the setting thereof, not to the signal lines which do not need to be set. Therefore, it becomes simpler to determine the capability of the test vector for the failure detection.

The Fifth Preferred Embodiment

Although the specific values are set to all of the signal lines, there may be a case where an element of which the output end connected to the signal line provided with the specific value outputs a determined value to the signal line. In such a case, the signal line does not need the setting of the specific value. Observation of the change of the values on the respective signal lines which are initially provided with the specific values in the simulation using the first test vector for each of the failures reveals the possibility of the change from a specific value to a determined value. Therefore, it is possible to check the necessity of the setting of the specific values by performing a simulation both in a normal circuit and in a failure circuit, instead of judgment in the step S30.

Figure 20:
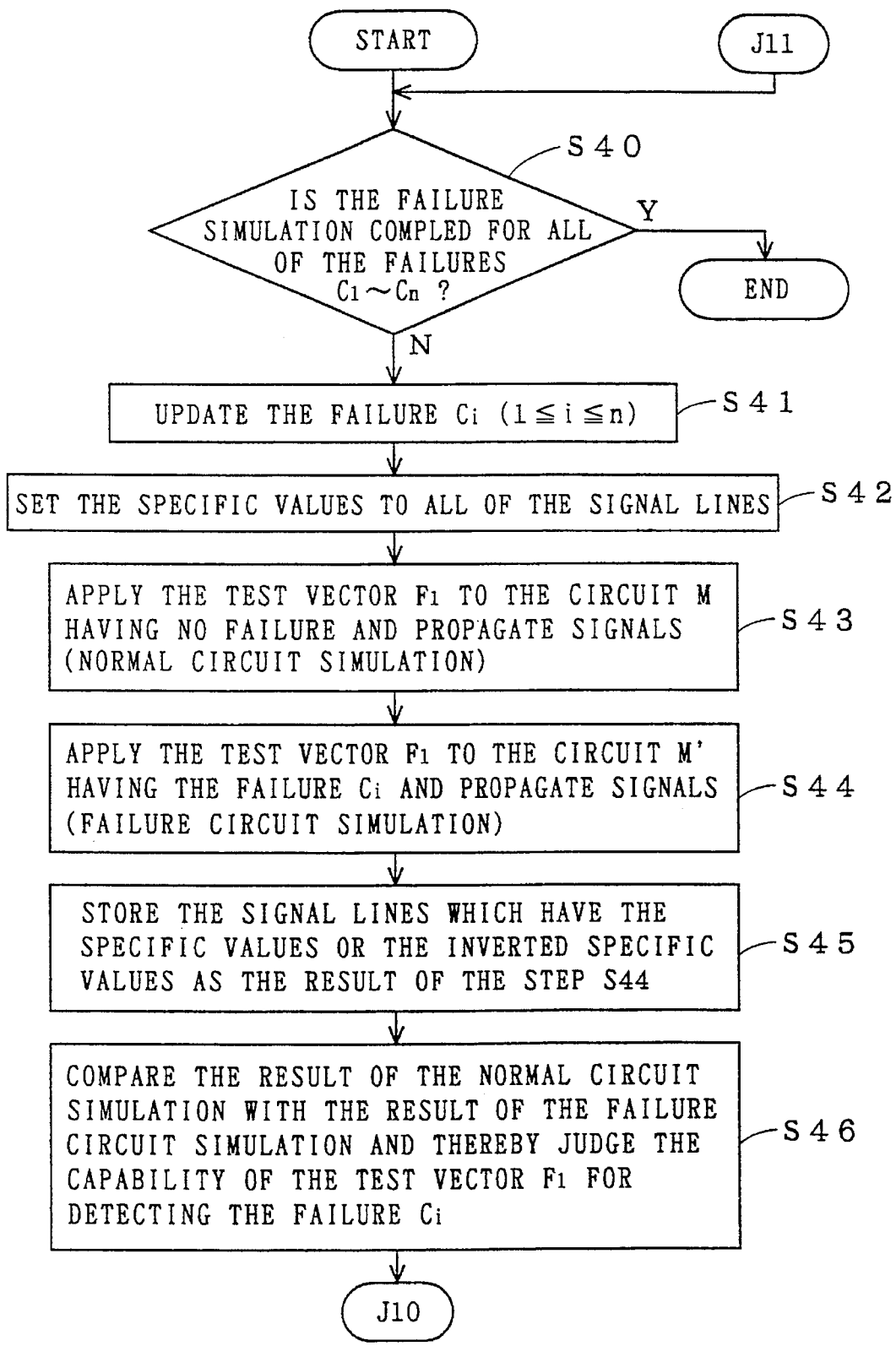
FIGS. 20 and 21 are flow charts cooperatively showing a fifth preferred embodiment of the present invention.
Figure 21:
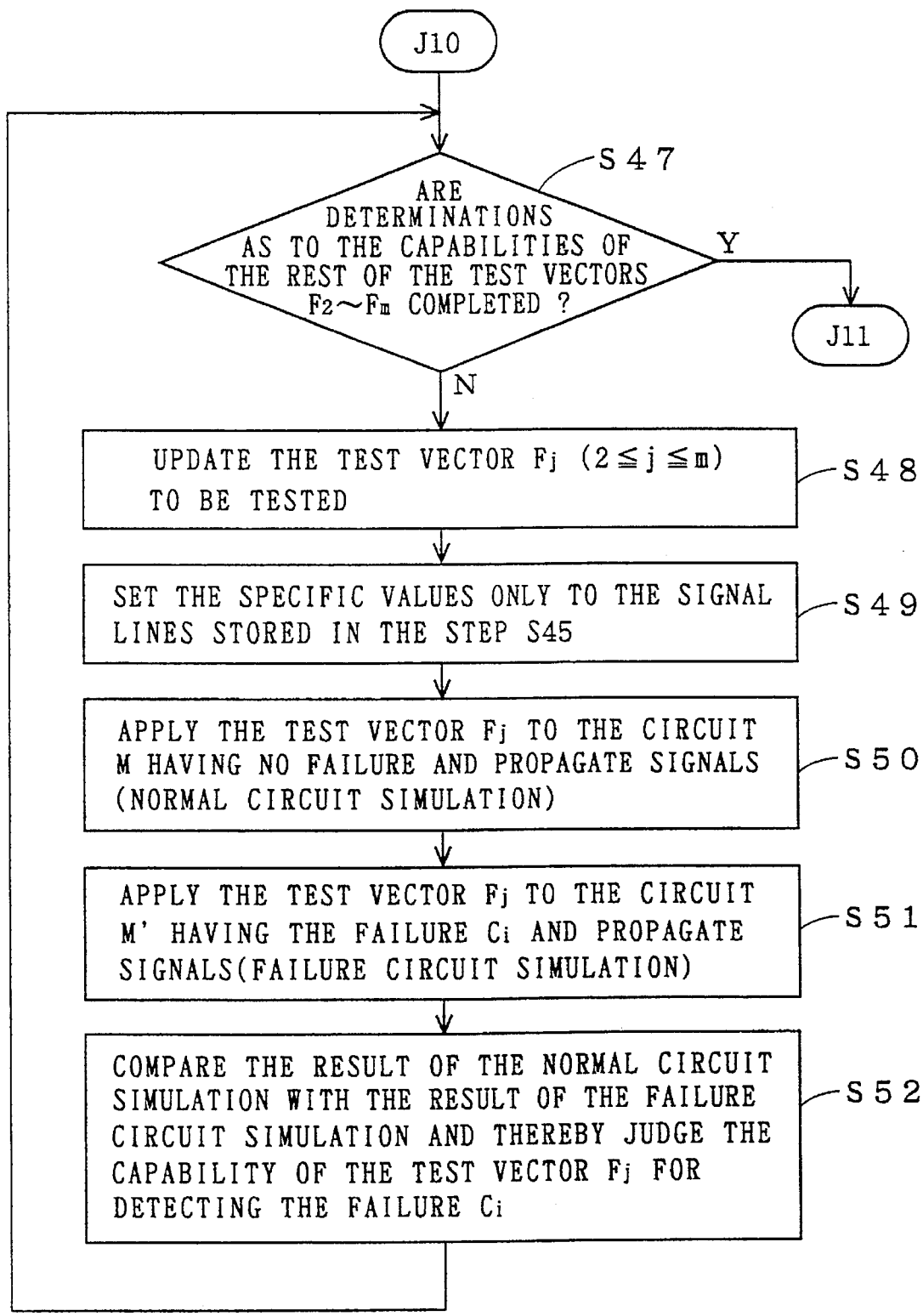

FIGS. 20 and 21 connected to each other at a junctions J10 and J11 are flow charts cooperatively showing the steps of the failure simulation method in accordance with the fifth preferred embodiment.

First, in the step S40, judgment is made as to whether the simulation is completed for all of the failures in the same way as the step S21. In the next step S41, an update of the failure $C_i$ is performed like in the step S22.

Then, in the step S43, the normal circuit simulation using the first test vector $F_1$ is performed. In the next step S44, the failure circuit simulation using the first test vector $F_1$ is performed. These two steps are performed like in the first preferred embodiment. In the step S42, the specific values are set to the all of the signal lines prior to the steps S43 and S44. As mentioned before, since the normal circuit M does not need the setting of the specific values, the setting of the specific values needs to be performed only in the circuit M' in the step S42.

After that, in the step S45, the signal lines having the specific values or the inverted specific values as the result of the failure circuit simulation of the step S44 are stored. It is not necessary, in contrast, to set the specific values to the signal lines having neither specific values nor inverted specific values as the result of the step S44 because the values on the signal lines are determined by the values on other signal lines like in the normal circuit simulation.

In the step S46, judgment is made as to the capability of the test vector $F_1$ for detecting the failure $C_i$.

In the steps S47 to S52, determinations are made as to the capabilities of the test vectors $F_2$ to $F_m$ for detecting the failure $C_i$. In the step S47, judgment is made as to whether determinations of the capabilities of all the rest of the test vectors are completed, and consequently in the step S48, an update of the test vector $F_j$ is performed.

In the step S49, the setting of the specific values is performed. At this time, the specific values are set only to the signal lines which have the specific values or the inverted specific values as the result of the failure circuit simulation of the step S45, i.e., the stored signal lines.

In the steps S50 and S51, the normal circuit simulation and the failure circuit simulation are performed, respectively. In the step S52, judgment is made as to the capability of the test vector $F_j$ for detecting the failure $C_i$.

In the above steps, for each of the failures, the setting of the specific values to all of the signal lines is required only at the first time. Since the signal lines which need the setting of the specific values are determined through the normal circuit simulation and the failure circuit simulation using the first test vector, it is not necessary, in the tests using the second and further test vectors, to set the specific values to the signal lines which do not need the setting of the specific values. Furthermore, the signal lines which need the setting of the specific values vary according to the type of failure. For this reason, the step S42 is carried out after the step S41 and before the step S43.

Thus, the fifth preferred embodiment achieves the same effect as the fourth preferred embodiment.

The Sixth Preferred Embodiment

The sixth preferred embodiment shows a preferred embodiment of the step S30 discussed in the fourth preferred embodiment.

For example, the signal lines 1 and 3 of FIG. 6 in the first preferred embodiment do not need the setting of the specific values. Since the signal line 1 is assumed to be stacked at 1, the value on the signal line 1 is immediately determined to be "1". When the value on the signal line 1 is "1", the OR gate 5 necessarily outputs the value "1" to the signal line 3. Therefore, the signal line 3 does not need the setting of the specific value.

As shown in FIG. 4, also in the case of the failure of the signal line 1 stacked at 0, the OR gate 5 outputs the value on the signal line 4 to the signal line 3. Accordingly, if only the signal line 4 has a specific value, the signal line 3 has the inverted logical value of the specific value on the signal line 4.

Thus, it is not necessary to set a specific value to a signal line connected to an output end of an element which determines an output value not depending on the propagation of "P". In other words, it is necessary to set a specific value to a signal line connected to an output end of an element which determines an output value depending on the propagation of "P" (in FIGS. 4 and 6, the flip flop 7).

However, all of the signal lines connected to the output end of the element receiving "P" do not need the setting of the specific values. The elements having no possibility of receiving the undefined value "X" naturally do not need the setting of the specific values. Therefore, a specific value needs to be set only to the signal line connected to the output end of the element which determines its output value depending on the propagation of "P" and which is located in the propagation loop of the failure propagation flag FLG- which has no possibility of being reset as discussed in the third preferred embodiment.

Figure 22:
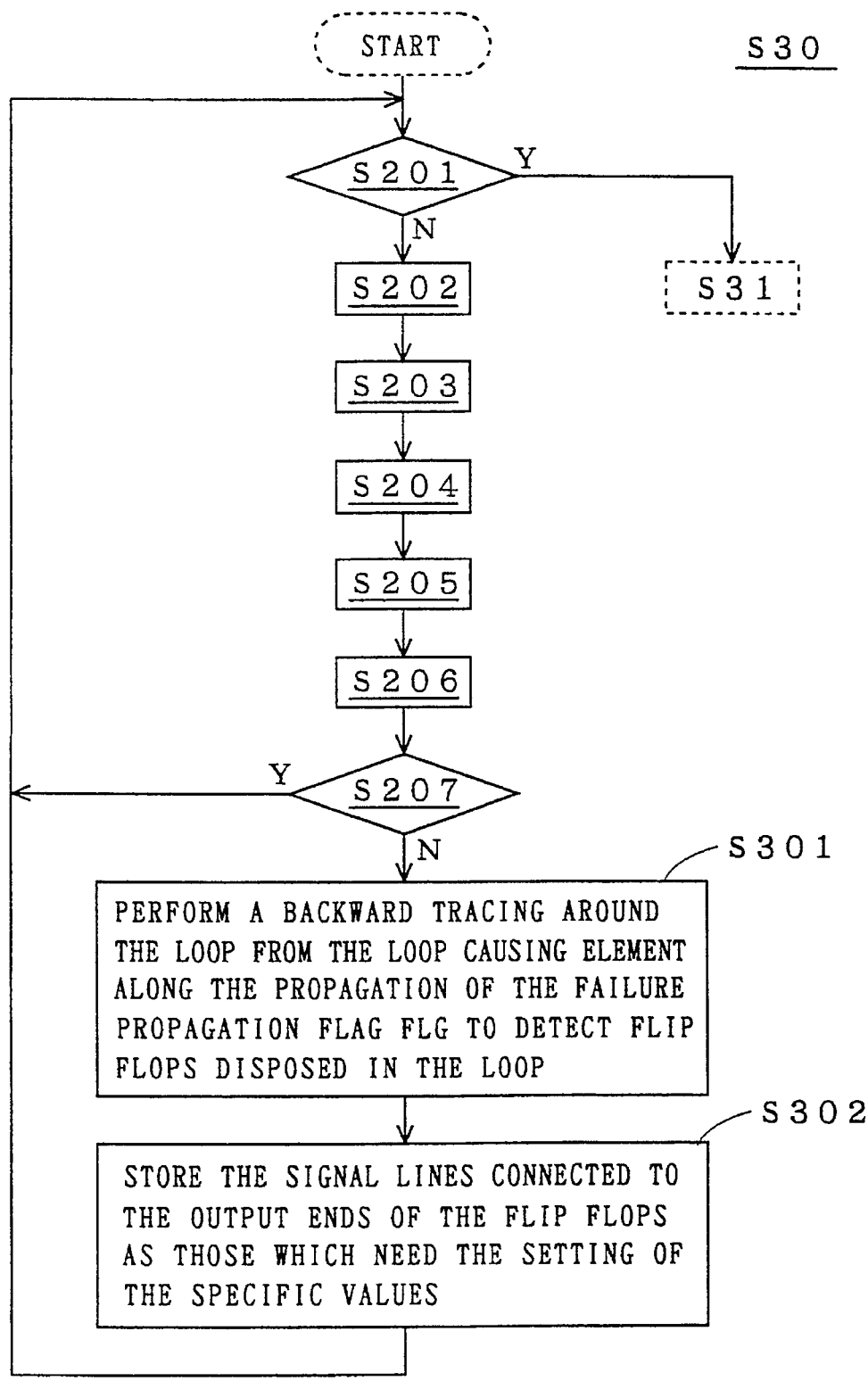
FIG. 22 is a flow chart of a sixth preferred embodiment of the present invention.
Figure 23:
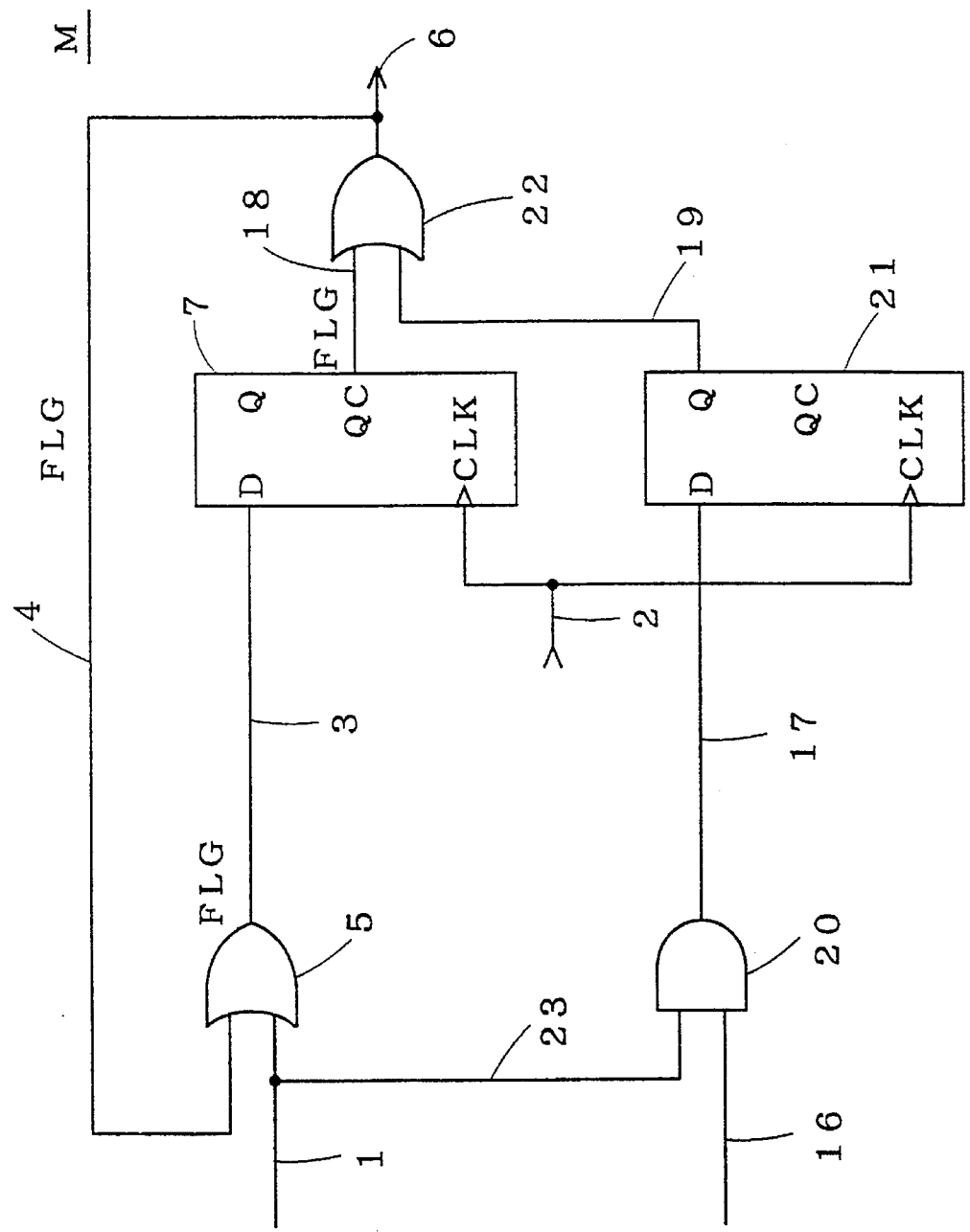
FIG. 23 is a circuit diagram illustrating the sixth preferred embodiment of the present invention.

FIG. 22 is a flow chart showing the details of the step S30. FIG. 23 is a circuit diagram showing a configuration of the circuit M to illustrate the step S30. At the beginning of the step S30, the same steps as the steps S201 to S207 are performed. In these steps, judgment is made as to the reset possibility with respect to the failure $C_i$.

If there is no reset possibility, a backward tracing in the loop is performed from the loop causing element along the propagation of the failure propagation flag FLG in the step S301. Through the backward tracing, a detection of flip flops in the loop is made. In the step S302, the signal lines connected to the output ends of the detected flip flops are stored as those which need the setting of the specific values. Again from the step S201, the same steps are repeated for all the rest of the failures.

Also if it is judged that there is a reset possibility in the step S207, it is not necessary to set the specific values to any signal lines and the step S201 will follow again.

In FIG. 23, the backward tracing starts from the OR gate 5 since it is the loop causing element. In the step S301, the OR gate 22 is skipped since it is not a flip flop and the flip flop 7 is detected. Then, in the step S302, the signal line 18 connected to the output end of the flip flop 7 is stored as the signal line which needs the setting of the specific value.

As discussed above, according to the sixth preferred embodiment, the detailed steps in the step S30 in accordance with the fourth preferred embodiment are preferably achieved.

While the invention has been shown and described in detail, the foregoing description is in all aspects illustrative and not restrictive. It is therefore understood that numerous modifications and variations can be devised without departing from the scope of the invention.

I claim:

1. A failure simulation method for determining whether a test vector is capable of detecting at least one type of failure occurring in a circuit to be tested, the circuit to be tested including a plurality of signal lines and at least one logical element, the test vector providing at least one of the signal lines with a logical value "1" or "0", the method comprising the steps of:

(a) preparing a failure circuit which corresponds to the circuit to be tested for the at least one type of failure, the failure circuit including a plurality of signal lines and at least one logical element;

(b) setting at least one specific value uniquely to the plurality of signal lines of the failure circuit, the at least one specific value representing either a logical value "1" or "0";

(c) applying the test vector to one of the plurality of signal lines of the circuit to be tested and to one of the plurality of signal lines of the failure circuit;

(d) propagating the test vector in the circuit to be tested and in the failure circuit and propagating the at least one specific value in the failure circuit;

(e) obtaining a normal result representing a value output from the logical element of the circuit to be tested which propagates on a specific one of the plurality of signal lines of the circuit to be tested and a failure result representing a value output from the logical element of the failure circuit which propagates on a specific one of the plurality of signal lines of the failure circuit; and (f) comparing the normal result with the failure result to determine whether the test vector is capable of detecting the failure.

2. The failure simulation method of claim 1, wherein the failure includes a condition where one of the plurality of signal lines of the failure circuit is stacked at 1 or 0.

3. The failure simulation method of claim 2, wherein the at least one specific value is set to all of the signal lines in said step (b).

4. The failure simulation method of claim 1, wherein the at least one specific value is set to the signal lines in the circuit to be tested in said step (b).

5. The failure simulation method of claim 1, wherein said at least one type of failure includes a plurality of types of failures, and the method further comprising, prior to said step (a), a step of:

(x) classifying the plurality of types of failures into a first group and a second group depending on the necessity of setting the specific values, the first group including failures that require setting of the specific values and the second group including failures that do not require setting of the specific values, wherein said step (b) is performed only for the failures included in the first group, and said steps (a) to (f) are performed with respect to each of the failures.

6. The failure simulation method of claim 5, wherein said step (x) includes:

(x-1) propagating a logical value in the failure circuit;

(x-2) specifying at least one of said logical elements from which said logical value cannot further propagate as a forefront signal input element;

(x-3) propagating a failure propagation flag on the at least one logical element starting from the forefront signal input element; and (x-4) judging whether a possibility exists of resetting a propagation loop of said failure propagation flag if said failure propagation flag propagates in a loop to classify said failures into the first group and the second group depending on said judging, the first group including the failures when the possibility of resetting does not exist, and the second group including the failures when the possibility of resetting exists.

7. The failure simulation method of claim 6, wherein:

said failure propagation flag propagates to an output end of said logical element in said step (x-3) only when all of the input ends other than the input end provided with said failure propagation flag included in said logical element meet any of the following requirements (x-3-1) the value thereof is undefined, (x-3-2) another failure propagation flag has been applied thereto, and (x-3-3) a certain value by which said logical element cannot uniquely determine its output value is applied thereto.

8. The failure simulation method of claim 7, wherein said step (x-4) includes:

(x-4-1) specifying at least one of the forefront signal input elements which causes said loop as a loop causing element;

(x-4-2) performing a forward tracing from the signal line having the failure to detect a specific element which is the logical element having an input end connected to one of said signal lines which propagates no failure propagation flag and of which logical value is undefined;

(x-4-3) setting the logical value to the input end of the specific element and propagating said logical value;

(x-4-4) judging that, there exists no possibility of resetting when the loop causing element includes no output end connected to the signal line of which the logical value is determined in said step (x-4-5); and (x-4-5) judging that there exists a possibility of resetting when all of loop causing elements include an output end connected to the signal line of which the logical value is determined ins aid step (x-4-3).

9. The failure simulation method of claim 8, further comprising, prior to said step (a) and after said step (x), a step of:

(y) detecting at least one of the plurality of signal lines which needs setting of the specific values, wherein in said step (b), the specific values are set only to the at least one signal line detected in said step (y), and said steps (a) to (f) are performed with respect to each of the plurality of types of failures.

10. The failure simulation method of claim 9, wherein said step (y) has steps of (y-1) performing a backward tracing from a loop causing element along propagation of said failure propagation flag to detect at least one of said logical elements which is disposed in the propagation loop and having an output by timing of activation of a clock signal; and (y-2) detecting at least one of the signal lines connected to an output end of the logical element detected in said step (y-1) as a signal line which needs setting of the specific value, wherein the loop causing element is the forefront signal input element causing said loop.

11. The failure simulation method of claim 1, wherein said at least one test vector includes a first test vector to an n-th test vector (n≧2), said step (b) has steps of (b-1) setting the specific values to all of the signal lines in the failure circuit;

(b-2) providing a first test vector both in the normal circuit and in the failure circuit;

(b-3) propagating the first test vector in said normal circuit;

(b-4) propagating the first test vector and the specific values in the failure circuit;

(b-5) storing at least one of the signal lines which propagates either the specific value or an inverted specific value in the step (b-4);

(b-6) obtaining the normal result and the failure result through said steps (b-3) and (b-4);

(b-7) comparing the normal result with the failure result obtained in said step (b-6) and thereby judging whether the first test vector is capable of detecting the failure; and (b-8) setting the specific values only to the signal lines stored in said step (b-6), wherein said steps (c) to (f) are performed with respect to each of a second test vector to said n-th test vector.

* * * * *